US 8,179,720 B2

(12) United States Patent
Fukuda et al.

(10) Patent No.: US 8,179,720 B2
(45) Date of Patent: May 15, 2012

(54) NAND FLASH MEMORY

(75) Inventors: Koichi Fukuda, Yokohama (JP);
Yasuhiko Matsunaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 253 days.

(21) Appl. No.: 12/727,817

(22) Filed: Mar. 19, 2010

(65) Prior Publication Data

US 2010/0238733 A1 Sep. 23, 2010

(30) Foreign Application Priority Data

Mar. 23, 2009 (JP) .................................. 2009-070701

(51) Int. Cl.
*G11C 11/34* (2006.01)

(52) U.S. Cl. ......... 365/185.03; 365/185.17; 365/185.22; 365/185.01; 365/185.14; 365/185.19; 365/185.23; 365/185.33

(58) Field of Classification Search ............. 365/185.17, 365/185.22, 185.01, 185.03, 185.14, 185.19, 365/185.23, 185.33
See application file for complete search history.

(56) References Cited

U.S. PATENT DOCUMENTS

| 5,930,173 | A |  | 7/1999 | Sekiguchi |  |
|---|---|---|---|---|---|
| 6,856,552 | B2 |  | 2/2005 | Takahashi |  |
| 6,999,343 | B2 | * | 2/2006 | Shim | ........................ 365/185.17 |
| 7,616,496 | B2 | * | 11/2009 | Choi et al. | ................ 365/185.19 |
| 2007/0036001 | A1 | * | 2/2007 | Kanda et al. | ............. 365/185.18 |
| 2008/0225595 | A1 | * | 9/2008 | Choi et al. | ................ 365/185.19 |
| 2009/0067251 | A1 | * | 3/2009 | Sarin et al. | ................ 365/185.19 |
| 2009/0273978 | A1 |  | 11/2009 | Fukuda |  |

FOREIGN PATENT DOCUMENTS

| JP | 6-21404 | 1/1994 |
|---|---|---|
| JP | 8-279297 | 10/1996 |
| JP | 2000-48581 | 2/2000 |
| JP | 2002-260390 | 9/2002 |
| JP | 2004-303399 | 10/2004 |
| WO | WO 98/18132 A1 | 4/1998 |

OTHER PUBLICATIONS

Koichi Fukuda, et al. "Random Telegraph Noise in Flash Memories—Model and Technology Scaling," IEEE, 2007. pp. 169-172.
C. Monzio Compagnoni, et al. "First evidence for injection statistics accuracy limitations in NAND Flash constant-current Fowler-Nordheim programming," IEEE, 2007. pp. 165-168.
Office Action issued Jul. 8, 2011, in Japanese Patent Application No. 2009-070701 with English translation.

* cited by examiner

*Primary Examiner* — Fernando Hidalgo
(74) *Attorney, Agent, or Firm* — Oblon, Spivak, McClelland, Maier & Neustadt, L.L.P.

(57) ABSTRACT

A NAND flash memory includes a NAND string and a control circuit, wherein in a write operation, the control circuit applies a writing voltage between a control gate of a selected memory cell to be written and a semiconductor well, and after the write operation and before performing a verification read operation of verifying whether data has been written into the selected memory cell, the control circuit performs a de-trapping operation, in which a first voltage of a same potential as that of the semiconductor well or a same polarity as that of the writing voltage is applied to the control gate of the selected memory cell and in which a second voltage of a same polarity as that of the writing voltage and larger than the first voltage as an absolute value is applied to a control gate of unselected memory cells not to be written.

16 Claims, 17 Drawing Sheets

BAND DIAGRAM
AT A TIME OF APPLYING
PROGRAM PULSE

BAND DIAGRAM
AT A TIME OF
VERIFICATION

BAND DIAGRAM
AT A TIME OF NORMAL
READING

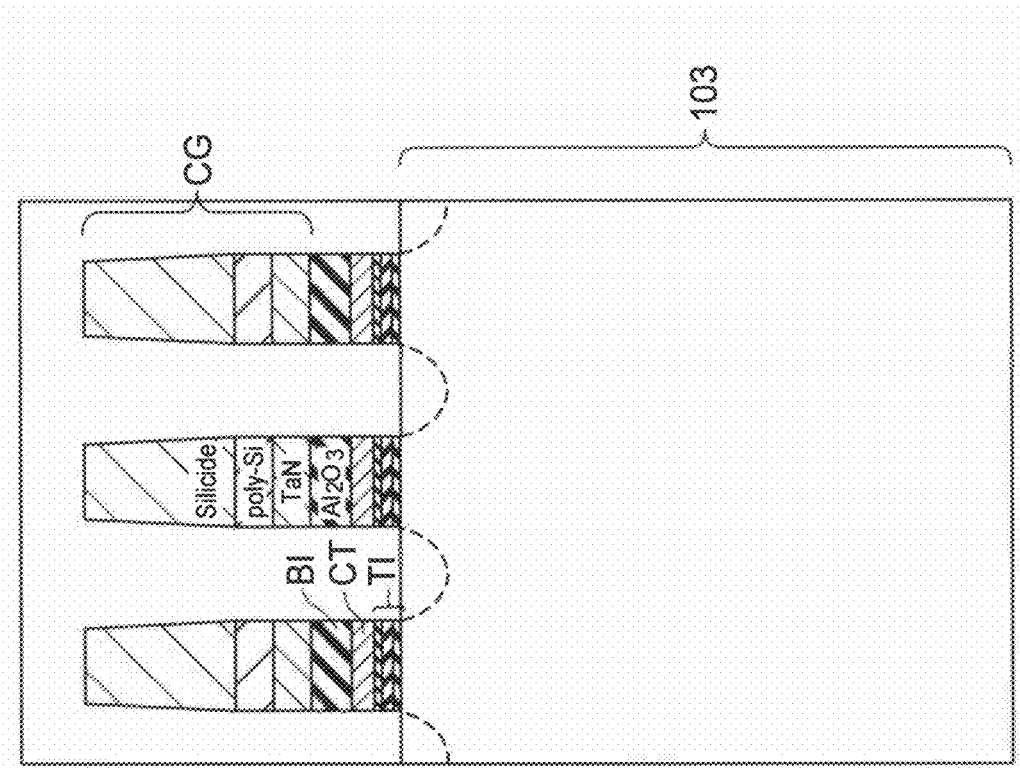
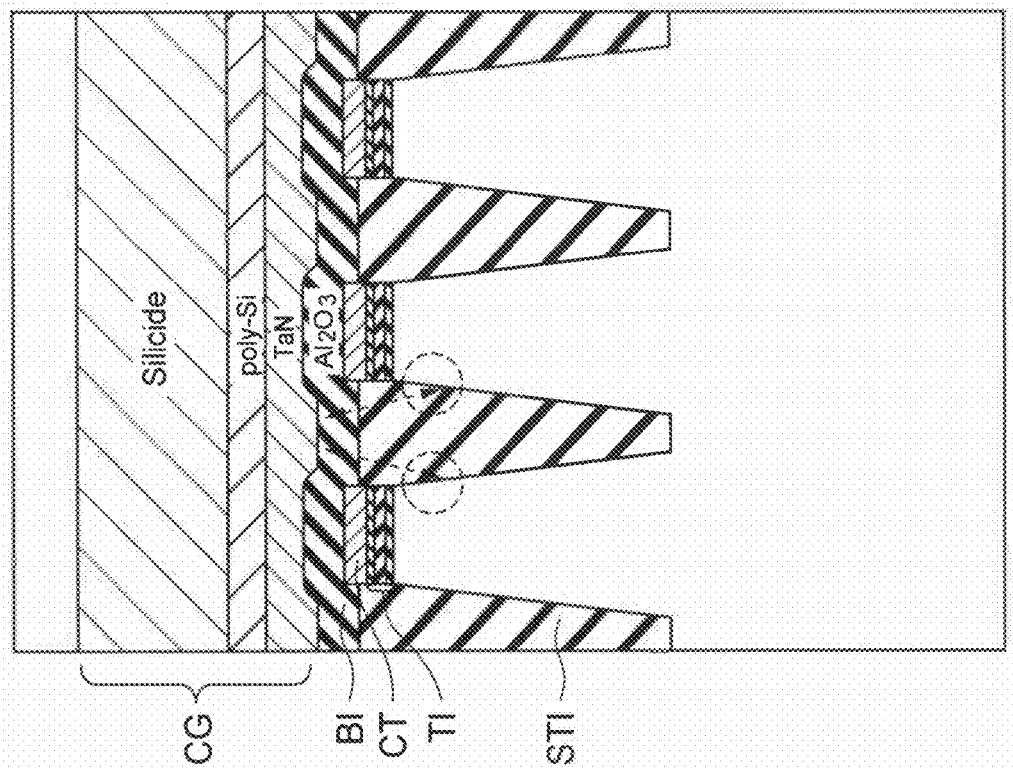

NAND FLASH MEMORY

CROSS-REFERENCE TO RELATED APPLICATION

This application is based upon and claims the benefit of priority from the prior Japanese Patent Applications No. 2009-70701, filed on Mar. 23, 2009, the entire contents of which are incorporated herein by reference.

BACKGROUND OF THE INVENTION

1. Field of the Invention

The present invention relates to a NAND flash memory.

2. Related Art

In a flash memory, writing and erasing of information, that is, injection and removal of charges, are performed by a tunnel current in a high electric field from a silicon substrate or a control gate, or by a hot-carrier from a silicon substrate.

When writing and erasing of information are repeated, a charge passes through a gate dielectric film repetitively, regardless of any method of injection. As a result, the gate dielectric film is damaged, and many electron traps and hole traps are generated within the gate dielectric film. The charge traps expand a distribution width of a threshold voltage of memory cells.

SUMMARY OF THE INVENTION

A NAND flash memory according to an embodiment of the present invention comprises: a NAND string in which a plurality of memory cells are connected in series to store information corresponding to an amount of charges held in a charge holding layer, the memory cells respectively comprising a semiconductor well on a surface of a semiconductor substrate, a first insulation film on the semiconductor well, the charge holding layer on the first insulation film, a second insulation film on the charge holding layer, and a control gate above the second insulation film; and a control circuit configured to control voltages applied to the control gate and the semiconductor well, wherein in a write operation, the control circuit applies a writing voltage between the control gate of a selected memory cell to be written and the semiconductor well, and after the write operation and before performing a verification read operation of verifying whether data has been written into the selected memory cell, the control circuit performs a de-trapping operation, in which a first voltage of a same potential as that of the semiconductor well or a same polarity as that of the writing voltage is applied to the control gate of the selected memory cell and in which a second voltage of a same polarity as that of the writing voltage and larger than the first voltage as an absolute value is applied to a control gates of unselected memory cells not to be written.

A NAND flash memory according to an embodiment of the present invention comprises: a NAND string in which a plurality of memory cells are connected in series to store information corresponding to an amount of charges held in a charge holding layer, the memory cells respectively comprising a semiconductor well on a surface of a semiconductor substrate, a first insulation film on the semiconductor well, the charge holding layer on the first insulation film, a second insulation film on the charge holding layer, and a control gate above the second insulation film; and a control circuit configured to control voltages applied to the control gate and the semiconductor well, wherein in a write operation, the control circuit applies a writing voltage between the control gate of a selected memory cell to be written and the semiconductor well, and after the write operation and before performing a verification read operation of verifying whether data has been written into the selected memory cell, the control circuit performs a de-trapping operation, in which a first voltage of a same potential as that of the semiconductor well or a same polarity as that of the writing voltage is applied to the control gate of the selected memory cell and in which a second voltage of a same polarity as that of the writing voltage and larger than the first voltage as an absolute value is applied to a control gate of a first unselected memory cell which is not adjacent to the selected memory cell, and a third voltage of a same polarity as that of the writing voltage and smaller than the second voltage as an absolute value is applied to a control gate of a second unselected memory cell which is adjacent to the selected memory cell.

BRIEF DESCRIPTION OF THE DRAWINGS

FIG. 2 shows a threshold voltage distribution including verification noise and the like;

FIGS. 11A and 11B are cross-sectional views showing a memory of a MONOS structure according to a second embodiment of the present invention;

DETAILED DESCRIPTION OF THE INVENTION

Figure 1A:
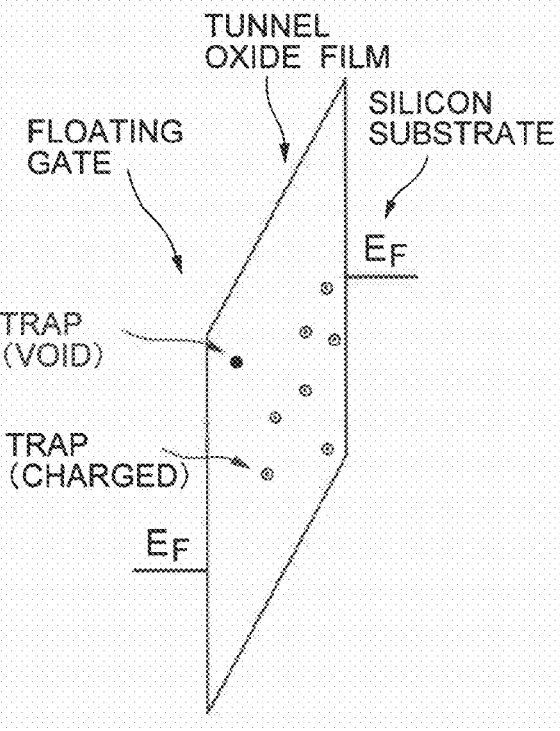
FIG. 1A is a schematic diagram showing a band structure near a tunnel oxide film in a state that a writing pulse is applied to a control gate.

Embodiments of the present invention will be explained below in detail with reference to the accompanying drawings. Note that the invention is not limited to the embodiments.

First Embodiment

Generally, types of nonvolatile semiconductor memory include a floating-gate memory, a SONOS (Silicon-Oxide-Nitride-Oxide-Silicon) memory, and a MONOS (Metal-Oxide-Nitride-Oxide-Silicon) memory.

These nonvolatile semiconductor memories store information (data) by holding charges (electrons or holes) in floating gates or in charge storage layers separated from the surroundings by insulation films made of $SiO_2$ and the like. A threshold voltage Vt of a memory cell transistor fluctuates according to the number of held charges, and thus the information (data) is identified by sensing the fluctuation of the threshold voltage Vt.

In the following explanations, it is assumed that charges accumulated in memory cells are electrons. A mode that accumulated charges are holes can be easily assumed from the following explanations, and thus detailed explanations of this mode will be omitted.

A fluctuation in a threshold voltage due to a unit charge (elementary charge e) increases along with downscaling of memory cells. For example, in a floating-gate flash memory of the 20-nm generation, when the number of electrons in a floating gate changes by one, the threshold voltage changes by about 5 mV to 20 mV.

When the fluctuation in a threshold voltage due to a unit charge increases, the influence of two kinds of random noise including program noise and read noise cannot be negligible.

The above program noise is caused by statistical fluctuations in the number of electrons injected into a floating gate or a charge holding layer by a single program (writing) pulse.

For example, when a threshold voltage is to be increased by 0.2 V by a signal writing pulse, ten to several tens of electrons on average are injected by a single writing pulse in 20-nm to 30-nm generation flash memories. The number of electrons injected by the single writing pulse follows the Poisson distribution, and accordingly, dispersion becomes large when the average number of injected electrons is reduced. That is, numbers of injected electrons are widely distributed around the average number of injected electrons, and changes in a threshold voltage by the single writing pulse are also widely distributed around 0.2 V.

When a write operation is to be performed by using step-up writing involving a verification operation, the influence of the program noise is represented as an expanded upper tail of a threshold voltage distribution. Further, the number of injected electrons necessary to generate a fluctuation in the same threshold voltage is reduced, as downscaling of memory cells progresses. Consequently, program noise increases.

The read noise described above is generated by electrons or positive holes randomly coming in and out of electron traps or hole traps present near an interface of a silicon substrate in a tunnel oxide film of a memory cell.

A change in a threshold voltage depends on whether electrons or positive holes are trapped in one electron trap or one hole trap. This change varies according to locations having the trap (a position in a channel region and a depth of a tunnel oxide film). Generally, this change is expressed by the following equation (1):

$$\Delta V th \approx q/(C ox * W * L) \tag{1}$$

where q represents elementary charge, Cox represents gate capacitance per unit area, W represents channel width, and L represents channel length.

Because a NAND flash memory uses a thick tunnel oxide film to secure a data holding characteristic, Cox is small and the fluctuation in a threshold voltage is large.

Furthermore, recent studies have proved that, considering percolation on a current path by impurity atoms doped into a silicon substrate, the fluctuation in a threshold voltage much larger than that expected by the equation (1) is generated. Further, it is known that dependence of scaling is not inversely proportional to W*L of the equation (1) but is approximately inversely proportional to $\sqrt{(W*L)}$. In fact, in a 50-nm generation NAND flash memory, a fluctuation of a threshold voltage exceeding 100 mV is observed.

A threshold voltage fluctuates according to whether a trap captures a charge when a read operation is performed. The influence of this read noise appears as expanded tails (an upper tail and a lower tail) of a threshold voltage distribution. Because the fluctuation in a threshold voltage increases in inverse proportion to $\sqrt{(W*L)}$ or in inverse proportion to (W*L), noise increases along with downscaling of memory cells. Noise exceeding 300 mV is expected to be generated in a 20-nm generation flash memory (see Non-patent literature 1).

Like read noise, verification noise is caused by electron traps or hole traps present in a tunnel oxide film of a memory cell. Verification noise is generated when an amount of charges captured by electron traps or hole traps changes between when verification reading is performed immediately after a writing pulse is applied and when a read operation is performed after a lapse of time since the verification reading.

Figure 1B:
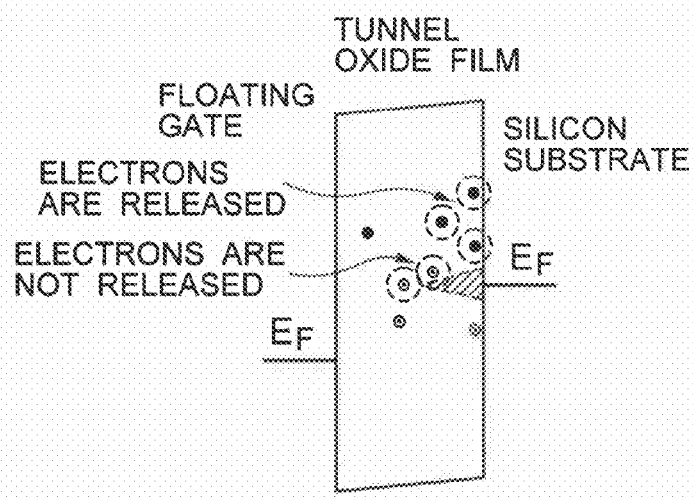
FIG. 1B is a schematic diagram showing a band structure near a tunnel oxide film during verification reading.
Figure 1C:
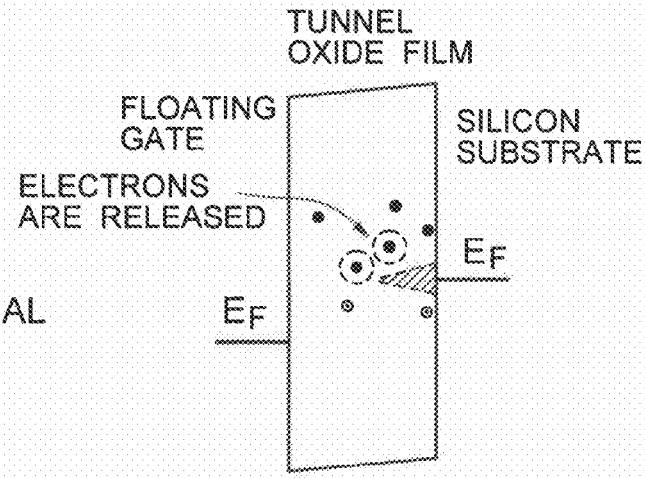
FIG. 1C is a schematic diagram showing a band structure near a tunnel oxide film during normal reading.
Figure 2:
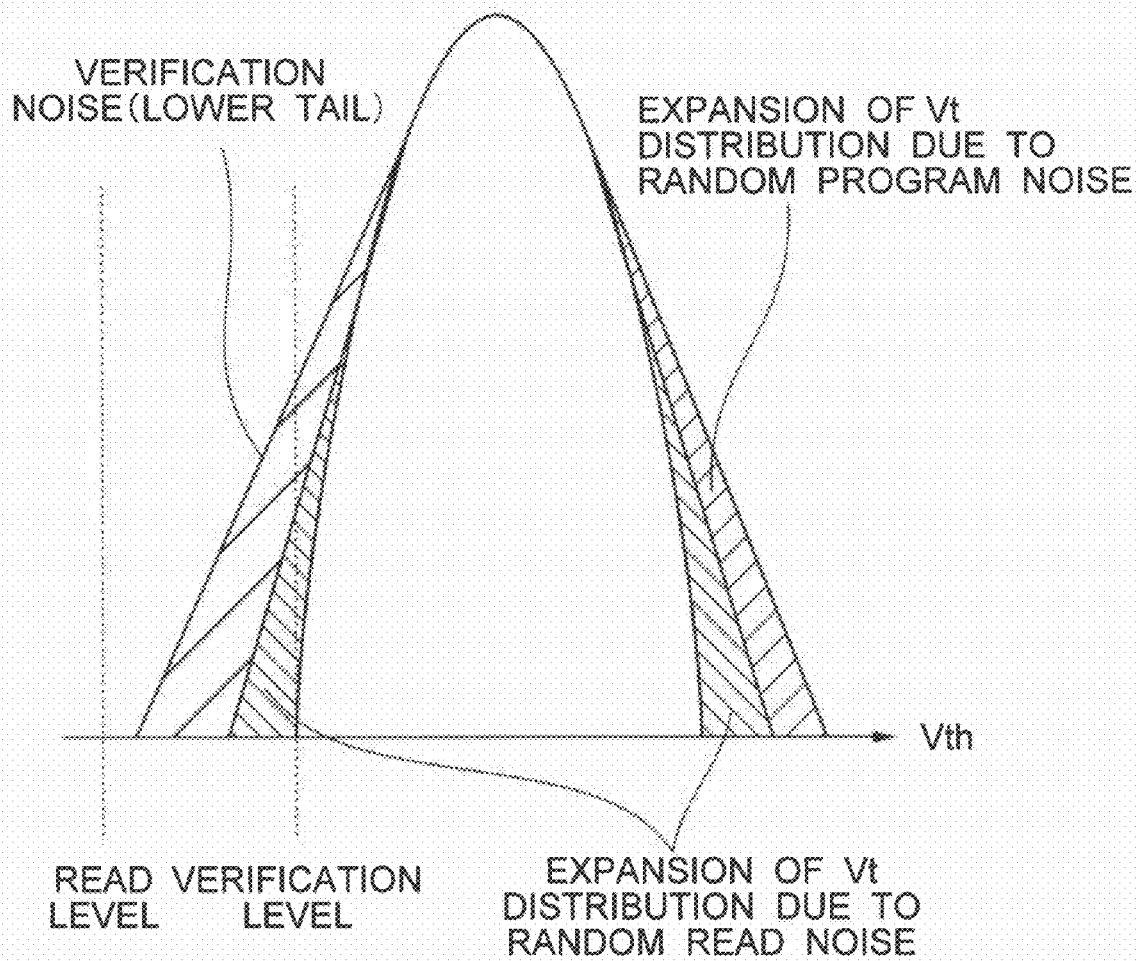

Verification noise is explained in more detail by taking an example of a floating-gate NAND flash memory. FIG. 1A is a schematic diagram showing a band structure near a tunnel oxide film in a state that a writing pulse is applied to a control gate. FIG. 1B is a schematic diagram showing a band structure near a tunnel oxide film during verification reading. FIG. 1C is a schematic diagram showing a band structure near a tunnel oxide film during normal reading. FIG. 2 shows a threshold voltage distribution including verification noise and the like.

For example, when a high voltage (10 V to 20 V) is applied to a control gate during a write operation, a high electric field is generated in a tunnel oxide film between a floating gate and a silicon substrate. As a result, an FN (Fowler-Nordheim) current flows, and electrons are injected into the floating gate. At this point, many electron traps in the tunnel oxide film are positioned below a Fermi level $E_F$ of the silicon substrate, and most of the electron traps capture the electrons (FIG. 1A).

After application of a writing pulse, when a gate voltage is returned to a voltage of about 0 V to a power source voltage, the Fermi level $E_F$ of the silicon substrate is reduced and the electron traps having captured electrons start releasing the electrons.

However, in several to several tens of microseconds before verification reading is performed, not all electron traps positioned above the Fermi level $E_F$ of the silicon substrate can release electrons. Therefore, a verification read operation is performed while a part of electrons remain unreleased (FIG. 1B).

When the electron traps in the tunnel oxide film keep having electrons, a threshold voltage of a memory cell increases for the same reason as that of read noise. When verification reading is performed in a state of a high threshold voltage, the write operation finishes when the high threshold voltage reaches a set level (a verification level). However, after the charge traps release charges after a lapse of time, a threshold voltage of the memory cell becomes lower than the set level (FIG. 1C).

Accordingly, during an actual read operation, reading is performed in the state of a low threshold voltage. Therefore, a memory cell at a lower threshold voltage than the set level is generated after writing. In other words, a threshold voltage distribution is expanded at a lower tail side of the threshold voltage distribution (FIG. 2).

A fluctuation in a threshold voltage due to one electron or positive hole captured by a trap is as explained in the read noise. The fluctuation becomes large when a memory is downscaled. Therefore, the verification noise also increases along with downscaling of memory cells, and generation of noise exceeding 300 mV is expected in a 20-nm generation flash memory.

In the program noise described above, fluctuations in the number of injected electrons can be reduced by increasing a writing pulse. The program noise can be suppressed by decreasing a fluctuation in a threshold voltage generated in one electron by increasing a coupling ratio between a control gate and a floating gate.

Meanwhile, the influence of the above read noise can be suppressed by averaging noise by increasing a sensing time (an observation time) during reading, reducing the number of traps in the tunnel oxide film, and suppressing percolation of a current path by reducing the number of impurity atoms doped in a channel region.

Program noise and read noise are both random noise, and the influence thereof can be reduced. However, such noise cannot be basically avoided in downscaled memory cells.

On the other hand, verification noise occurs due to a larger number of electrons or positive holes trapped in the tunnel oxide film during verification reading than the number in a normal read operation. This verification noise can be theoretically eliminated by de-trapping charges captured by electron traps or hole traps by a writing pulse, and by setting the number of trapped charges at a verification reading time equal to that in a normal read operation.

In a first embodiment of the present invention, verification noise is reduced by setting the number of trapped charges at a verification reading time substantially equal to that in a normal read operation. With this arrangement, expansion of a distribution width of a threshold voltage in memory cells is suppressed.

A floating-gate NAND flash memory is exemplified in the first embodiment. The first embodiment can be also similarly applied to a SONOS (or MONOS) NAND flash memory.

Figure 3:
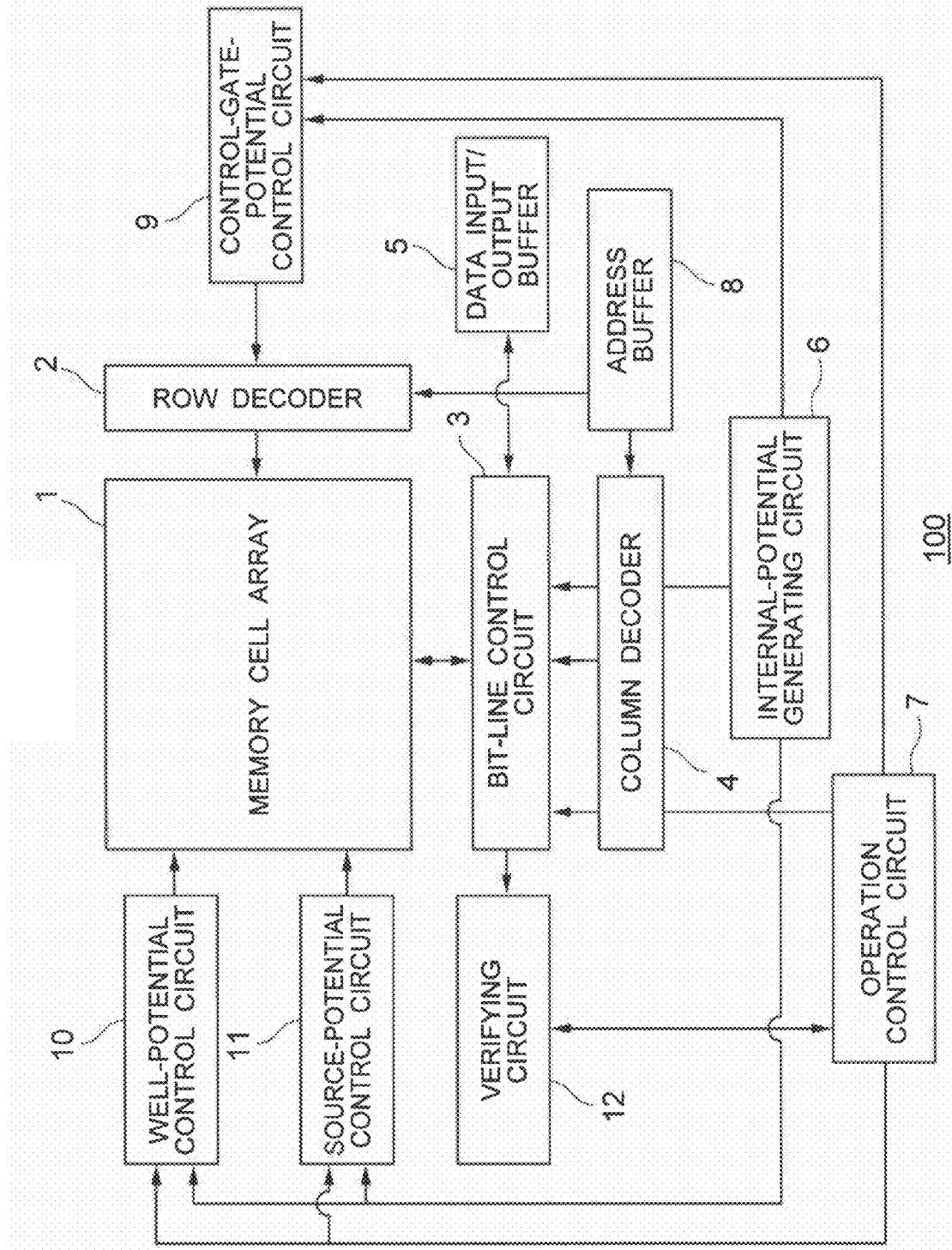
FIG. 3 is a block diagram showing a configuration of relevant parts of a NAND flash memory 100 according to the first embodiment.
Figure 4:
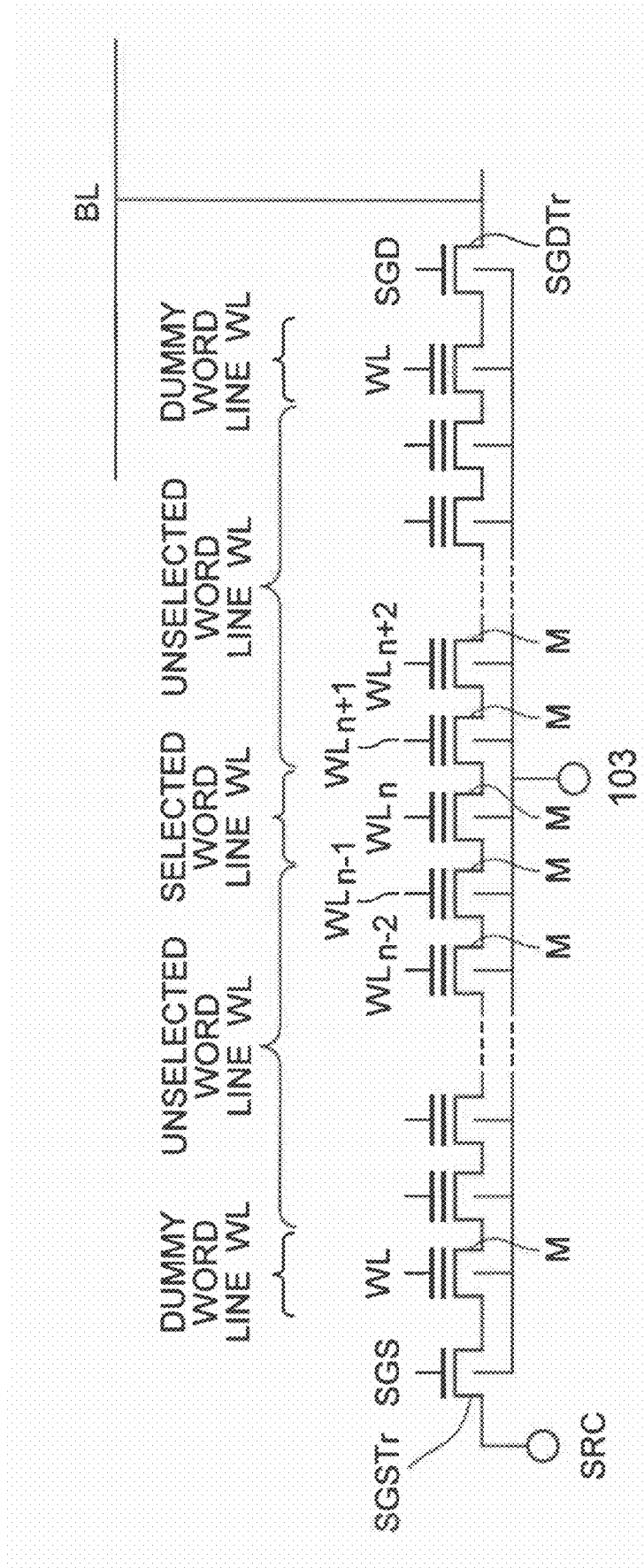
FIG. 4 is a circuit diagram showing a circuit configuration of a NAND string in a column direction within a memory cell array 1 in FIG. 3.
Figure 5:
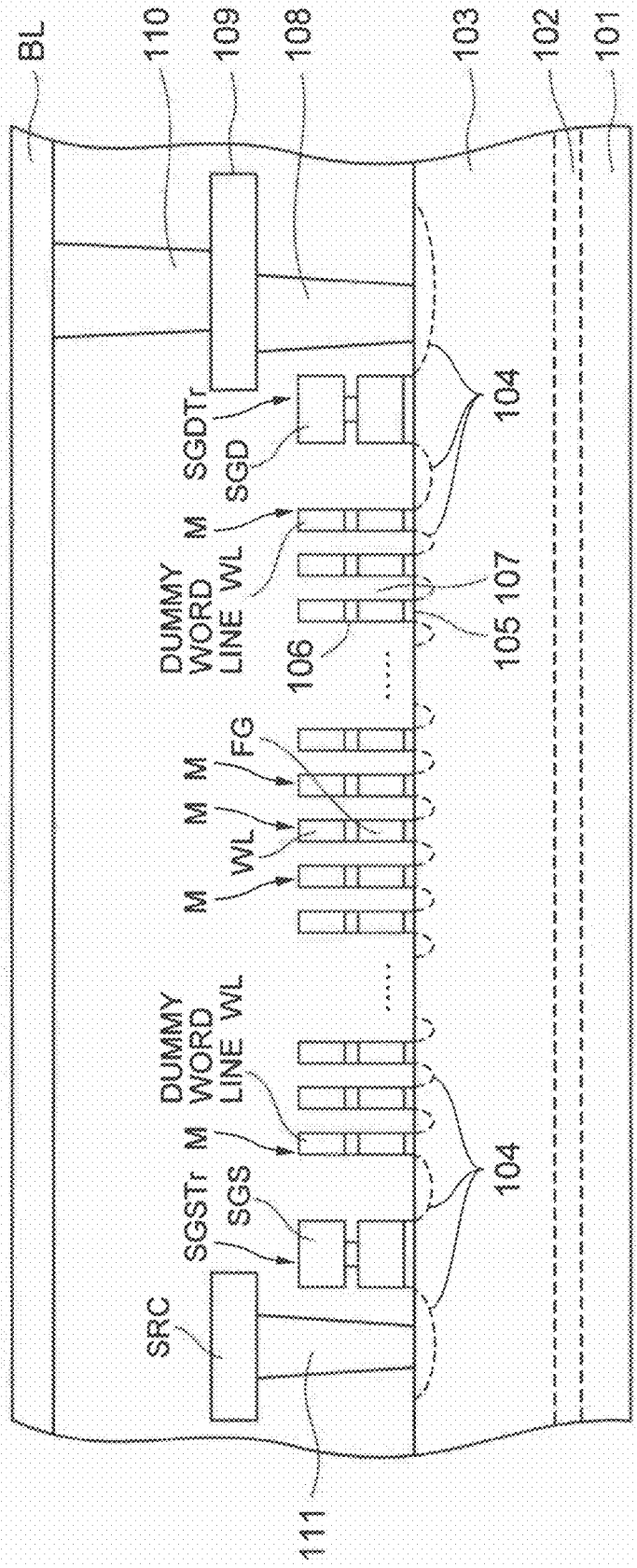
FIG. 5 is a cross-sectional view showing an element structure of the NAND string in FIG. 4.

FIG. 3 is a block diagram showing a configuration of relevant parts of a NAND flash memory 100 according to the first embodiment as one aspect of the present invention. FIG. 4 is a circuit diagram showing a circuit configuration of a NAND string in a column direction within a memory cell array 1 in FIG. 3. FIG. 5 is a cross-sectional view showing an element structure of the NAND string in FIG. 4. The NAND string includes plural memory cells M connected in series, and two selector gates (an SGS transistor and an SGD transistor) connected to both ends of the connected memory cells M. A selector gate at a source side is connected to a source line SRC, and a selector gate at a drain side is connected to a bit line BL.

As shown in FIG. 3, the NAND flash memory 100 includes the memory cell array 1, a row decoder 2, a bit-line control circuit 3, a column decoder 4, a data input/output buffer 5, an internal-potential generating circuit 6, an operation control circuit 7, an address buffer 8, a control-gate-potential control circuit 9, a well-potential control circuit 10, a source-potential control circuit 11, and a verifying circuit 12.

The memory cell array 1 has plural NAND strings arranged in a matrix shape, each NAND string connected to word lines WL in a row direction and bit lines BL in a column direction.

The row decoder 2 includes a word-line driving circuit (not shown), and selects and drives word lines of the memory cell array 1.

The bit-line control circuit 3 includes a circuit (not shown) controlling potentials of bit lines BL, a sense amplifier (not shown) sensing voltages of bit lines during a verification read operation and a read operation, and a data latch (not shown) storing a read result or written data and the like. The bit-line control circuit 3 performs write control, verification reading, and a read operation, by controlling potentials of bit lines BL. The NAND flash memory generally performs a write operation and a read operation on each page of 512 bytes to 8 kilobytes. That is, the bit-line control circuit 3 can simultaneously control the bit lines BL corresponding to 512 bytes to 8 kilobytes in a page.

The column decoder 4 selects the bit-line control circuit 3 connected to the bit lines of the memory cell array 1, corresponding to an input address.

During data reading, data read by the bit-line control circuit 3 is output to an input/output control circuit (not shown) through the data input/output buffer 5.

The internal-potential generating circuit 6 boosts or steps down a power source voltage to generate a voltage supplied to the bit-line control circuit 3, the control-gate-potential control circuit 9, the well-potential control circuit 10, and the source-potential control circuit 11.

The control-gate-potential control circuit 9 controls a voltage applied to a control gate CG of the memory cell M, and supplies the voltage to the row decoder 2.

The well-potential control circuit 10 controls a potential of a cell well 102 of a semiconductor substrate 101.

The source-potential control circuit 11 controls a potential of the source line SRC.

When external control signals such as a chip enable signal CE, a write enable signal WE, a read enable signal RE, an address latch enable signal ALE, and a command latch enable signal CLE are input to an input pin (not shown), and also when a command code is input to an input/output data pin (not shown), from the outside of a chip, a command code is supplied to a command buffer (not shown) via the input/output control circuit (not shown). The command buffer decodes the command code, and supplies the command code to the operation control circuit 7 as a command signal.

The operation control circuit 7 performs sequence control of data writing and erasing, and a control of data reading, based on a command signal supplied according to an operation mode.

The operation control circuit 7 outputs signals to control various operations such as reading, writing, and erasing. Accordingly, the bit-line control circuit 3, the internal-potential generating circuit 6, the control-gate-potential control circuit 9, the well-potential control circuit 10, and the source-potential control circuit 11 generate potentials for the operations. The operation control circuit 7 outputs a signal to control a verification operation, and the verifying circuit 12 performs a verification operation.

Addresses of the memory cells M supplied from the input/output control circuit (not shown) are transferred to the row decoder 2 and the column decoder 4 via the address buffer 8.

The verifying circuit 12 determines whether threshold voltages of all of the predetermined memory cells M have reached a verification level (whether data are written or erased in the memory cells) in a page to be written or in a block to be erased, based on a sensed result in the bit-line control circuit 3 during a verification read operation. The verifying circuit 12 outputs a determination result to the operation control circuit 7. The operation control circuit 7 controls the bit-line control circuit 3, the control-gate-potential control circuit 9, the well-potential control circuit 10, and the source-potential control circuit 11 based on the verification result, and continues a write operation or an erase operation until when threshold voltages of all the memory cells M reach (pass) the verification level in the page to be written or in the block to be erased.

Some verifying circuits 12 have a function of counting the number of the memory cells M (the number of bits) having not reached the verification level or the number of bit lines or columns connected to the memory cells M having not reached the verification level. In this case, when the number of the memory cells M having not reached the verification level in the page to be written or in the block to be erased or the number of bit lines or columns connected to the memory cells M having not reached the verification level is smaller than a predetermined permissible number of bits or bytes, the write operation or the erase operation can be discontinued at that moment.

A state that the number of bits or columns having not reached the verification level is not larger than the permissible number of bits or bytes is called "pseudo pass", whereas a state that all the bits or columns have reached the verification level is called "pass".

In a NAND flash memory, an ECC technique is used to correct several to several tens of defective bits generated by various disturbances or defective data holding characteristics and the like. However, when the number of correctable bits is sufficient, a write operation or erase operation can be discontinued as pseudo pass, and some of the memory cells M can be left below the verification level without any problem. With this arrangement, it becomes unnecessary to repeat a write operation or erase operation for the memory cells M with taking a long time for writing or erasing, thereby improving the write performance or erase performance.

A configuration of the NAND string is explained in further detail. As shown in FIGS. 4 and 5, a cell well 103 of a p-type semiconductor surrounded by the cell well 102 of an n-type semiconductor is formed on the p-type semiconductor substrate 101. A diffusion layer 104 of an n-type semiconductor is formed on this cell well 103. Each of the memory cells M includes a source and a drain configured by the diffusion layer 104, a floating gate FG, and the control gate CG. The floating gate is a charge holding layer provided on a channel region between the source and the drain via a tunnel oxide film 105. The control gate CG is provided on the floating gate FG via an insulating film 106, and functions as a word line WL. The insulating film 106 is preferably a high dielectric-constant film. The insulating film 106 is a laminated film of a silicon oxide film and a silicon nitride film, for example.

The floating gate FG is separated from the surroundings by the tunnel oxide film 104, the insulating film 106, and an interlayer film 107. When the NAND flash memory is a SONOS (or MONOS) flash memory, a charge holding layer is not the floating gate FG but is a charge storage layer made of a silicon nitride film and the like.

Figure 6:
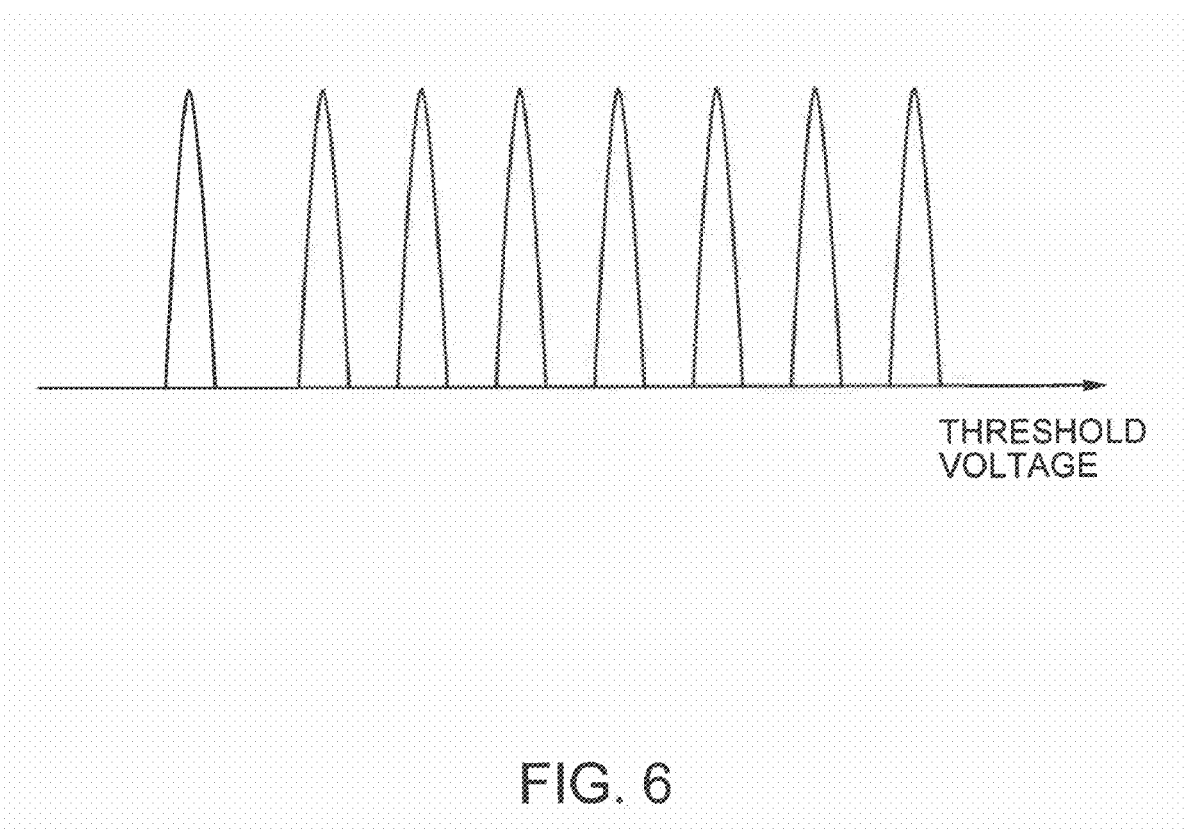
FIG. 6 shows a threshold voltage distribution.

The memory cell M can store different states of bit information according to a threshold voltage corresponding to an amount of charges held in the floating gate FG. FIG. 6 shows a threshold voltage distribution. As shown in FIG. 6, for example, when the threshold voltages are controlled in eight states, three-bit information can be stored in each of the memory cells M. The bit information stored in the memory cell M can be read by applying a selected reading voltage to a selected word line WL (the control gate CG) and by applying an unselected reading voltage to an unselected word line (the control gate CG).

In the cell well 103, a selector gate transistor SGDTr provided at a drain side of a NAND string and a selector gate transistor SGSTr provided at a source side of the NAND string are also formed.

The selector gate transistor SGDTr includes a source and a drain configured by the diffusion layer 104, and a selector gate line SGD having a structure of two layers electrically connected to each other. The drain of the selector gate transistor SGDTr is connected to the bit line BL via a contact electrode 108, a metal wiring layer 109, and an interwiring electrode 110. The selector gate transistor SGDTr is controlled by applying a voltage to the selector gate line SGD from the row decoder 2.

The selector gate transistor SGSTr includes a source and a drain configured by the diffusion layer 104, and a selector gate line SGS having a structure of two layers electrically connected to each other. The source of the selector gate transistor SGSTr is connected to the source line SRC via a contact electrode 111. The selector gate transistor SGSTr is controlled by applying a voltage to the selector gate line SGS from the row decoder 2.

Between a drain of the selector gate transistor SGSTr at a source side and a source of the selector gate transistor SGDTr at a drain side, a plurality of the memory cells M are connected in series by sharing the source and the drain. A NAND string is formed by the selector gate transistor SGSTr at a source line side, a plurality of the memory cells M connected in series, and the selector gate transistor SGDTr at a drain side.

In the first embodiment, the memory cells M adjacent to the selector gate transistors SGSTr and SGDTr are set as dummy cells to prevent erroneous writing. During a write operation, a low voltage from other selected word lines WL and unselected word lines WL is applied to word lines WL of the dummy cells.

As described above, the row decoder 2, the control circuits 3, 7, 9, 10, and 11, and the internal-potential generating circuit 6 control operations of the memory cells M by controlling a voltage applied to the control gates CG (word lines), the cell well, the source line, and the bit lines.

A write operation of the NAND flash memory 100 having the above-described configuration is explained next. The NAND flash memory uses a step-up writing system of repeating application of a writing pulse and verification reading while gradually increasing a writing voltage Vpgm until when memory cells to be written are written to a desired level.

Figure 7:
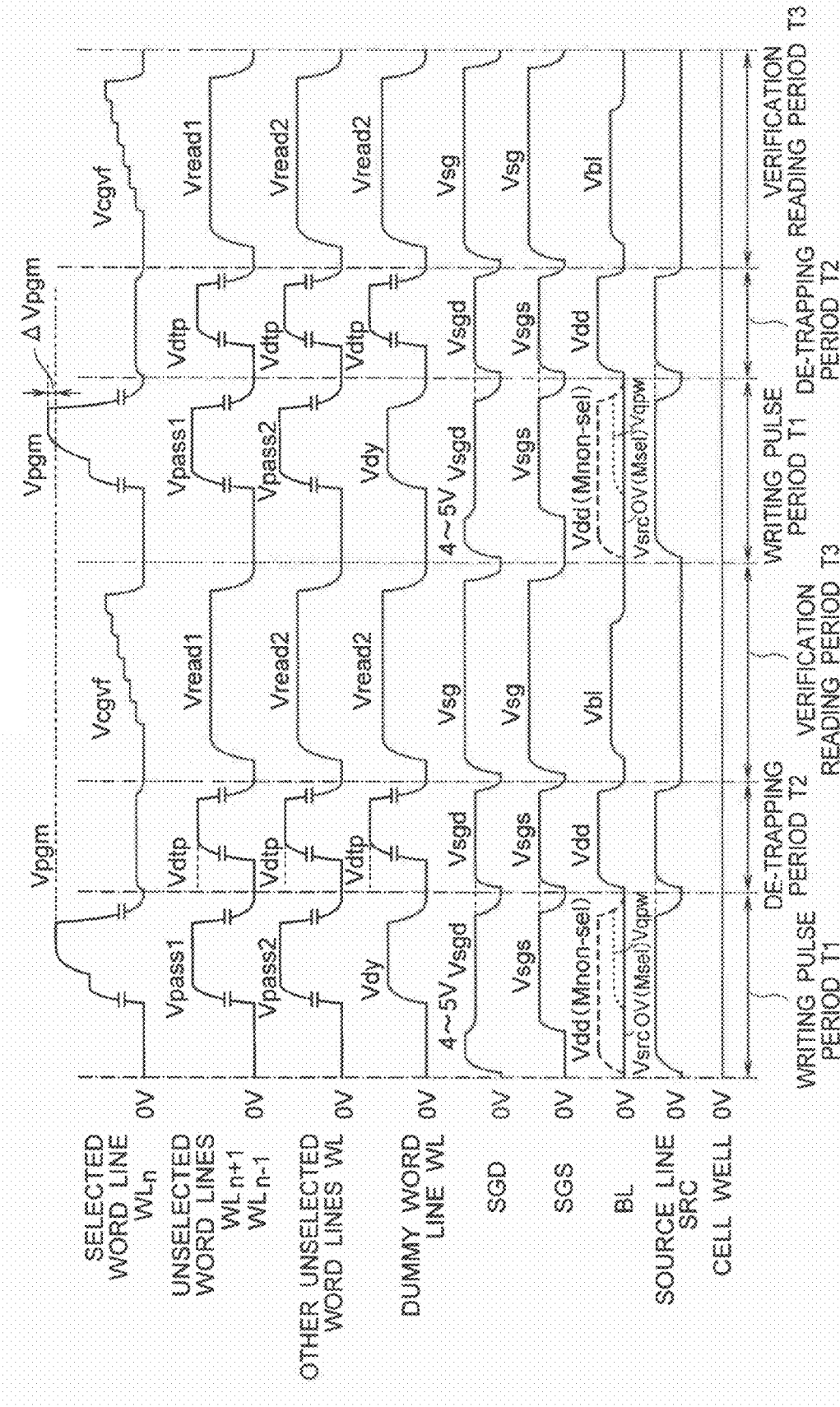
FIG. 7 shows voltage waveforms of word lines, a bit line, selector gate lines, a source line, and a cell well during a write operation of the NAND flash memory 100 according to the first embodiment.

FIG. 7 shows voltage waveforms of word lines, a bit line, selector gate lines, a source line, and a cell well during a write operation of the NAND flash memory 100 according to the first embodiment. For simplicity, FIG. 7 shows only two repetitions of a writing sequence of application of a writing pulse, a de-trapping operation, and a verification read operation in step-up writing. One writing pulse application, one de-trapping operation, and one verification read operation are called a writing sequence for one time. In practice, the writing sequence is repetitively performed until when data is written into memory cells.

As shown in FIG. 7, first, in a writing pulse period T1, the bit-line control circuit 3 applies 0 V to the bit line BL connected to a memory cell Msel to be written in a certain page, and applies Vdd (about 2 V to 3 V) to the bit line BL connected to unselected memory cells Mnon-sel not to be written (that is, memory cells in which writing is inhibited). The source-potential control circuit 11 applies Vsrc (1 V to 3 V) to the source line SRC.

Data stored in a plurality of the memory cells M that are connected to one selected word line WL and can be simultaneously accessed are set as one page. Generally, data is written and read in each one page.

In order to transfer Vdd from the bit line BL to a NAND string having unselected memory cells M, a voltage of 4 V to 5 V is applied to the selector gate line SGD at a drain side.

The control-gate-potential control circuit 9 and the row decoder 2 set voltages of the selector gate lines SGD and SGS, respectively to intermediate potentials Vsgd and Vsgs between 0 V and Vdd. The control-gate-potential control circuit 9 and the row decoder 2 apply the writing voltage Vpgm (for example, about 10 V to 25 V) to a selected word line WLn, apply a voltage Vpass1 (for example, about 5 V to 10 V) to unselected word lines WLn+1 and WLn−1 adjacent to the selected word line WLn, and apply a voltage Vpass2 (for example, about 5 V to 10 V) to other unselected word lines WLn+2 and WLn−2 or the like.

Accordingly, in the selected memory cell M, the writing voltage Vpgm is applied to the control gate CG, and 0 V is applied to channels via the bit line BL. A cell well potential is 0 V. Therefore, the writing voltage Vpgm is applied between the control gate CG and the cell well (the silicon substrate) 103. As a result, a Fowler-Nordheim tunnel current is generated by a high electric field, and electrons are injected from channels to the floating gates FG. That is, a write operation is performed.

On the other hand, in a NAND string in which writing is inhibited, the selector gate transistors SGSTr and SGDTr are both turned off. Accordingly, channels in the NAND string become in a floating state. Potentials of channels in the floating NAND string are boosted to about 4 V to 7 V by the unselected word line voltages Vpass1 and Vpass2 and by the writing voltage Vpgm applied to the selected word line. Consequently, in the NAND string in which writing is inhibited, while the writing voltage Vpgm is applied to the selected word line WLn, electrons are not injected into floating gates by the Fowler-Nordheim tunnel current because an electric field in a tunnel oxide film is insufficient. That is, a write operation is not performed.

The unselected word line voltage Vpass1 and the unselected word line voltage Vpass2 can be equal to each other or can be set at different voltages according to need. In down-scaled NAND flash memories in the 40-nm or subsequent generations, capacitance coupling between a floating gate of the memory cell M to be written and the control gate CG of an adjacent memory cell M cannot be negligible. Accordingly, the voltage Vpass1 applied to the unselected word line adjacent to the selected word line is set higher than the unselected word line voltage Vpass2, thereby supporting writing on the selected word line.

Dummy word lines WL are applied with an intermediate voltage Vdy between 0 V and the unselected word line voltage Vpass2. Accordingly, erroneous writing on the memory cells M at ends of the NAND string can be prevented, by suppressing GIDL (gate induced drain leakage) generated at channel ends of a boosted potential.

As described above, in the writing pulse period T1, the bit-line control circuit 3 applies 0 V to bit lines BL connected to the selected memory cell M. When a quick pass write (QPW) system is used, the bit-line control circuit 3 applies a voltage Vqpw higher than 0 V (for example, 1 V) to the bit line BL connected to the selected memory cell M of which threshold value exceeds a quick-pass write level slightly lower than a verification level Vbl. With this arrangement, writing to the selected memory cell can be suppressed after the threshold value exceeds a quick-pass write verification level. As a result, a narrower threshold value distribution can be achieved.

When a memory cell in which writing is inhibited is present in a certain page, the bit-line control circuit 3 applies Vdd to the bit line BL connected to the memory cell in which writing is inhibited. In this case, the selector gate transistor SGDTr is set to an on state by applying 4 V to 5 V to the selector gate line SGD. Vdd is applied from a bit line to the memory cell in which writing is inhibited connected to the selected word line WL, via the selector gate transistor SGDTr. With this arrangement, writing to the memory cell in which writing is inhibited connected to the selected word line WL can be prevented.

In this way, the row decoder 2, the control circuits 3, 7, 9, 10, and 11, and the internal-potential generating circuit 6 control the voltage applied to the control gates CG (word lines), the cell well, the source line, and the bit lines during a write operation, thereby performing the write operation to only the memory cell M to be written in the page.

By applying the writing voltage Vpgm during the writing pulse period T1, a large number of electron traps present in the tunnel oxide film (an oxide film or a nitride oxide film provided between the cell well and the floating gate FG) of the memory cell M capture electrons. After the writing pulse period T1 is completed and the application of the writing voltage Vpgm is stopped, electrons are released (de-trapped) from the electron traps having captured charges, following a time constant of each trap. Because some traps have long time constants, many of the traps cannot release electrons in several microseconds to several milliseconds.

Next, in a de-trapping period T2, the source-potential control circuit 11 keeps the source line SRC at Vsrc (1 V to 3 V), and the well-potential control circuit 10 keeps the cell well at 0 V. The bit-line control circuit 3 applies Vdd to the bit line. The control-gate-potential control circuit 9 and the row decoder 2 set voltages of the selector gate lines SGD and SGS, respectively to the intermediate potentials Vsgd and Vsgs between 0 V and Vdd.

Thereafter, the control-gate-potential control circuit 9 and the row decoder 2 apply a low voltage (a first voltage) of about 0 V to 2 V to the selected word line WLn, and apply a second voltage Vdtp (for example, about 5 V to 12 V) to unselected word lines WL other than the selected word line WLn.

The first voltage is equal to a voltage (0 V) of the silicon substrate (the cell well) 103 or a voltage (0 V to 2 V) biased to a polarity (a positive polarity) of the writing voltage Vpgm. The second voltage is in the same polarity (a positive polarity) as that of the writing voltage Vpgm, and is also larger than the first voltage as an absolute value.

Figure 8:
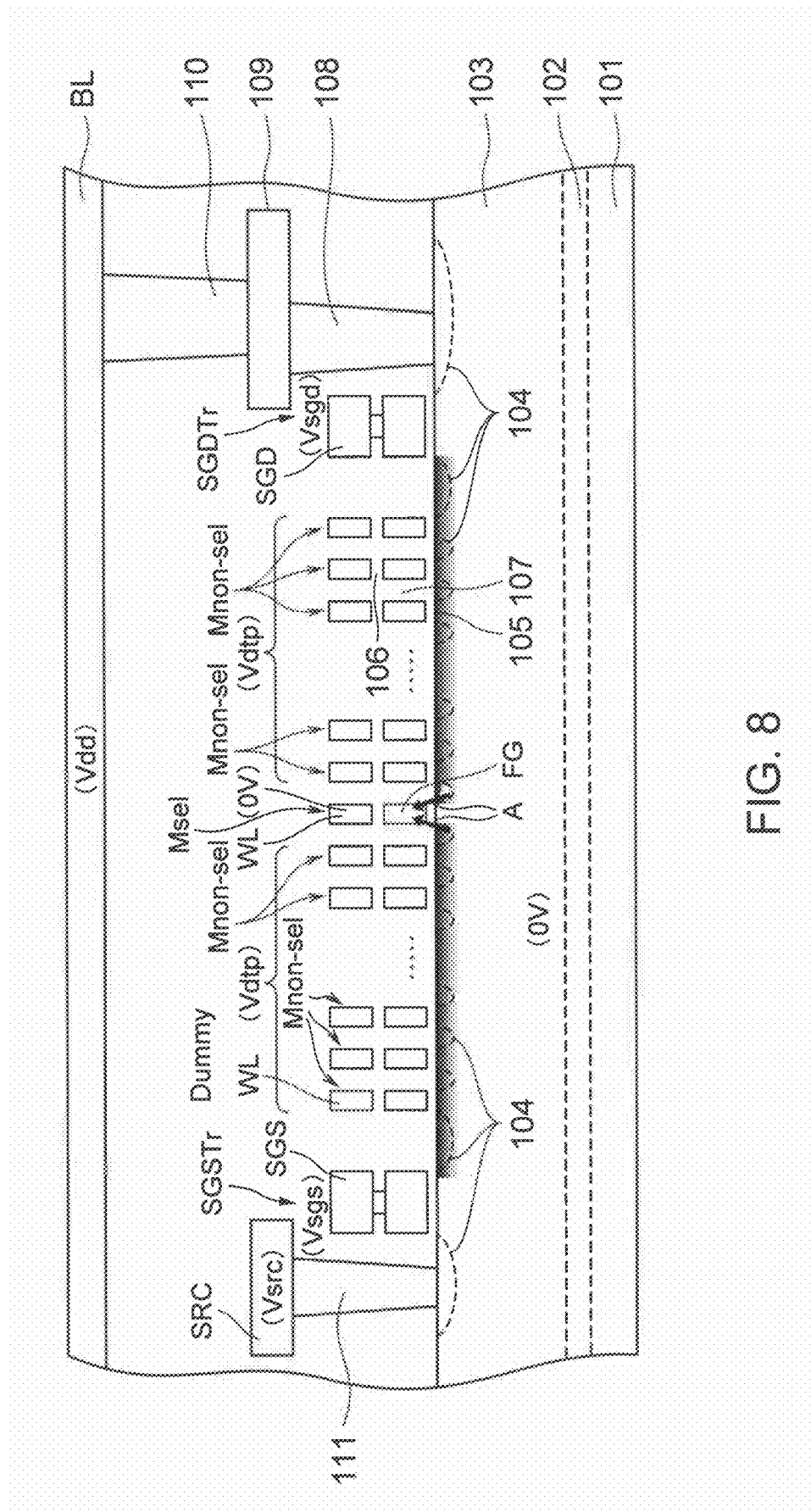
FIG. 8 is a schematic diagram showing a state that a potential of a channel of the NAND string is boosted.

A potential of a channel of a NAND string, that is, a potential of a surface of the silicon substrate (the well) 103, is boosted by the second voltage Vdtp applied to the unselected word lines WL. FIG. 8 is a schematic diagram showing a state that a potential of a channel of the NAND string is boosted. Numerals within parentheses represent the voltage applied to each portions. The control gate CG of the selected memory cell Msel is applied with 0 V. The control gates CG of other unselected memory cells Mnon-sel are applied with the second voltage Vdtp (for example, about 5 V to 12 V). The second voltage Vdtp applied to the unselected word lines WL boosts the potential on the surface of the silicon substrate (the well) 103. A grey region in FIG. 8 shows a boosted state. Because the control gate of the selected memory cell Msel is at 0 V, a potential of the channel immediately below the center of the selected memory cell Msel is slightly lower than a potential of the surroundings. However, a potential of the channel below the end of the selected memory cell Msel is sufficiently boosted by the second voltage Vdtp. With this arrangement, an electric field is applied to a direction of an arrowhead A between a floating gate FG of the selected memory cell Msel and the silicon substrate (the well) 103.

As described above, the row decoder 2, the control circuits 3, 7, 9, 10, and 11, and the internal-potential generating circuit 6 apply 0 V (the first voltage) to the control gate CG of the selected memory cell Msel and apply the second voltage Vdtp to the control gates CG of the unselected memory cells Mnon-sel, before a verification operation is performed. With this arrangement, an electric field A in an opposite polarity (an opposite direction) to that of an electric field applied between the control gate CG and the silicon substrate (the well) 103 at a writing time can be applied between the control gate CG and the silicon substrate (the well) 103.

The electric field A prompts de-trapping of electrons captured by electron traps in the tunnel oxide film in the writing pulse period T1. Consequently, when performing verification reading in a next verification reading period T3, the number of electrons captured in the tunnel oxide film can be reduced.

Generally, a read operation is performed in a steady state having electrons completely released (de-trapped) after a lapse of a sufficient time since a write operation. By providing a de-trapping operation between a write operation and a verification read operation, the number of trapped electrons in the tunnel oxide film in the verification read operation can be set substantially equal to the number of trapped electrons in a steady state. That is, in the de-trapping period T2, a state of a charge trapped in the verification read operation can be set nearer to a state of a charge trap in a normal read operation. In other words, a threshold voltage of the selected memory cell Msel in the verification read operation after the de-trapping period T2 can be set substantially equal to a threshold voltage of the selected memory cell Msel in the normal read operation. As a result, verification noise shown in FIG. 2 can be suppressed, and expansion of a threshold voltage distribution after writing can be suppressed.

A de-trapping voltage Vdtp is set sufficiently smaller than a writing voltage as an absolute value applied to the control gate CG during a write operation in such a manner that charges accumulated in the floating gate FG are not discharged. On the other hand, preferably, the de-trapping voltage Vdtp is a sufficiently higher voltage than a voltage (0 V to 1 V) applied to the selected word line WLn. For example, the de-trapping voltage Vdtp can be equal to or slightly lower than the voltage Vpass1 or Vpass2 of the unselected word lines during a write operation.

Figure 9:
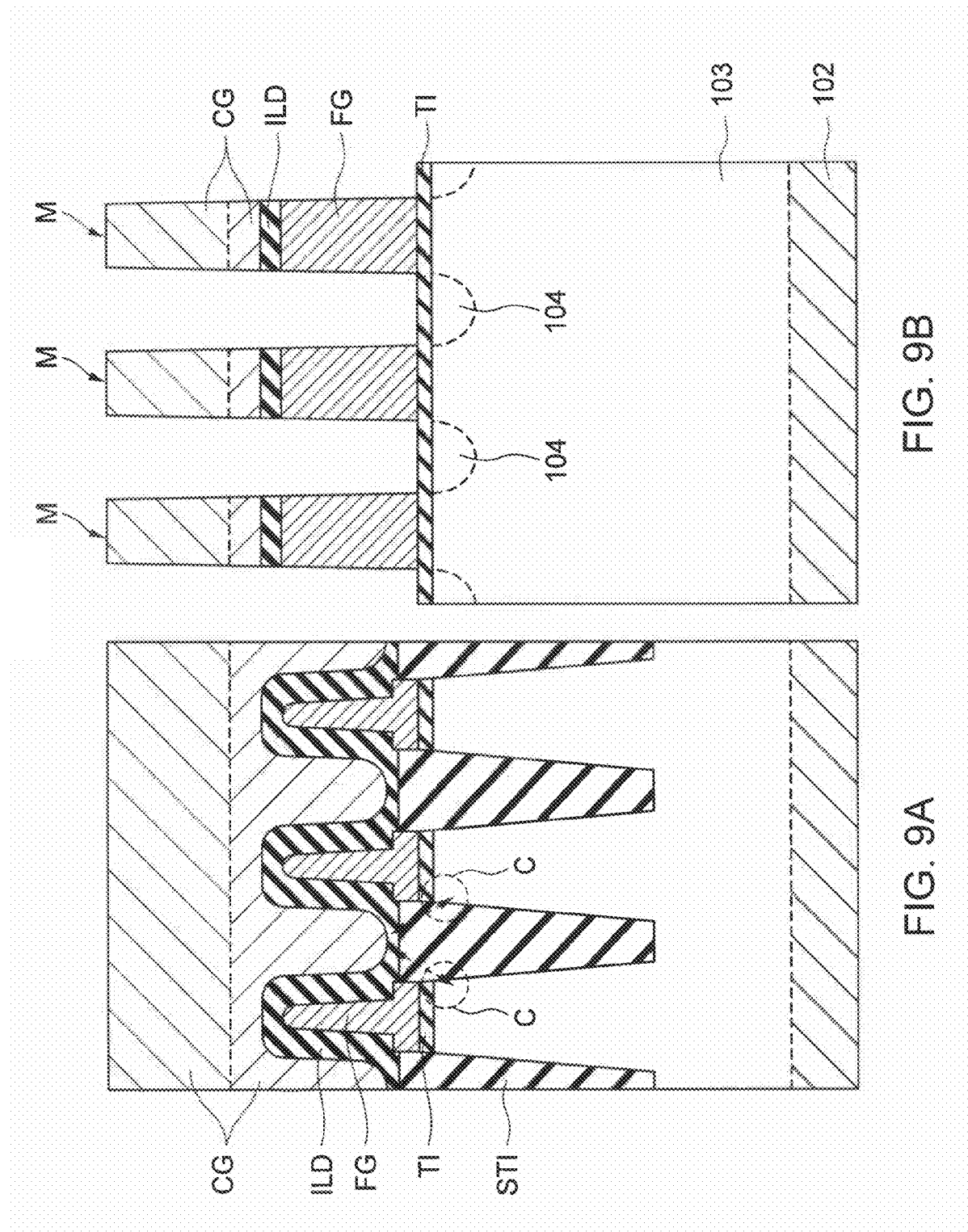
FIG. 9A is a cross-sectional view of a memory along an extension direction of the control gate CG.
FIG. 9B is a cross-section view of the memory cell along an extension direction of the bit line BL.

FIG. 9A is a cross-sectional view of a memory along an extension direction of the control gate CG (the word line WL). FIG. 9B is a cross-section view of the memory cell along an extension direction of the bit line BL. FIG. 9A shows a cross section of three NAND strings. FIG. 9B shows three memory cells M within a certain NAND string.

In practice, as shown in FIG. 9A, the control gate CG has a structure between two adjacent floating gates as well as on the floating gate FG, in order to increase a coupling ratio between the control gate CG and the floating gate FG.

When the control gate CG is set between the two adjacent floating gates FG in this way, the control gate CG also comes near to the silicon substrate (the well). Accordingly, a large electric field is applied between the control gate CG and the silicon substrate (the well) in a write operation and an erasure operation. For example, in a write operation, 15 V to 25 V is applied to the control gate CG, and a surface potential of the silicon substrate (the well) 103 is 0 V to 1 V. In an erasure operation, 15 V to 25 V is applied to the silicon substrate (the well) 103, and a potential of the control gate CG is 0 V to 1 V.

Many charge traps are formed at an edge portion at an STI side of a tunnel oxide film TI, due to a strong electric field between the control gate CG and the silicon substrate (the well) 103. A de-trapping operation according to the first embodiment can forcibly eliminate electrons trapped at the edge portion at the STI side of the tunnel oxide film TI.

Thereafter, in the verification reading period T3 shown in FIG. 7, a verification read operation is performed. The control-gate-potential control circuit 9 and the row decoder 2 apply a voltage Vsg (for example, 4 V to 5 V) to turn on the selector gate transistors SGSTr and SGDTr, to the selected gate lines SGS and SGD. The source-potential control circuit 11 and the well-potential control circuit 10 keep the voltage of the source line SRC and the cell well at 0 V.

Next, the control-gate-potential control circuit 9 and the row decoder 2 apply a reading voltage Vread1 to unselected word lines WLn+1 and WLn−1 adjacent to the selected word line WLn, and apply a reading voltage Vread2 to unselected word lines WLn+2 and WLn−2, or the like separated from (not adjacent to) the selected word line WLn. Accordingly, the memory cells M connected to the unselected word lines are all sufficiently set to an on state. A verification level Vcgrv is applied to the selected word line WLn.

The reading voltage Vread1 and the reading voltage Vread2 are generally set to the same potentials. In the down-scaled NAND flash memories in the 40-nm or subsequent generations, capacitance coupling between the selected word line and the floating gate of the adjacent cells becomes noticeable. Due to the influence of the capacitance coupling, current driving force of mutually adjacent memory cells has a risk of being reduced. In order to compensate for a reduction of the current driving capacity, the reading voltages Vread1 and Vread2 can be differentiated from each other.

The bit-line control circuit 3 applies a voltage Vbl (for example, about 0.5 V) for reading to the bit line BL. At this time, a sensing circuit included in the bit-line control circuit 3 senses a current passing through the memory cell M. The sensing circuit determines whether a threshold value of the memory cell M to be verified is higher or lower than the verification level Vcgvf by the amount of a current flowing into the memory cell M.

In the first embodiment, three bits (octal) are assumed to be stored in a single memory cell. In this case, a verification voltage Vcgvf is changed seven times to repeat a sensing operation.

In this way, the sensing circuit senses a size relationship between a threshold voltage of the memory cell M connected to the selected word line WLn and the verification voltage Vcgvf. A latch circuit included in the bit-line control circuit 3 latches data corresponding to a result of sensing.

Thereafter, based on the latched data, the verifying circuit 12 determines whether threshold voltages of all memory cells to be written in a page or whether threshold voltages of all memory cells other than a predetermined permissible number of bits or bytes have reached a verification level (whether the memory cells are written enough), that is, whether writing verification is "pass".

As described above, electrons captured by the electron traps in the tunnel oxide film are de-trapped during the de-trapping period T2. Accordingly, the number of electrons trapped during verification reading can be set substantially equal to the number of trapped electrons in a steady state in a normal read operation.

Accordingly, verification reading and normal reading can be performed at substantially the same threshold voltage. As a result, the number of memory cells which are verification read at different threshold voltages can be reduced even when the number of memory cells is increased. That is, verification noise can be reduced.

Thereafter, when the verifying circuit 12 does not determine that writing verification is "pass", the writing voltage Vpgm is increased by ΔVpgm, and a series of writing sequences in T1 to T3 is repeated. The writing voltage Vpgm is increased by ΔVpgm each time when the writing sequence is repeated. When writing verification is not "pass" after repeating the writing sequence by a predetermined number of times, writing is regarded as no good and the write operation is finished.

When the writing verification is "pass", the writing is regarded as being passed and the write operation on the corresponding page is finished.

As described above, according to the first embodiment, after a writing pulse is applied, a de-trapping operation is performed before verification reading is performed. Generally, a NAND flash memory employs in many cases a configuration in which a negative voltage cannot be applied to a word line, in order to facilitate a process and reduce its circuit area. In the de-trapping operation according to the first embodiment, the control-gate-potential control circuit 9 and the row decoder 2 do not apply a negative potential to the word line WL. In the first embodiment, even when a negative potential is not applied to word lines WL, a negative electric field A (charge holding layer potential<silicon substrate potential) can be applied to a tunnel dielectric film between the charge holding layer (for example, the floating gate FG) and a silicon substrate.

In order to apply the negative electric field A to a tunnel dielectric film, a method of increasing the entire potential of the cell well 103 is considered. However, in order to increase the entire potential of the cell well 103 to equal to or higher than a power source potential, a booster circuit needs to charge a well of a sufficiently large capacitance. Therefore, control of the entire potential of the cell well 103 requires a long time, and increases current consumption.

On the other hand, in the first embodiment, a potential of only a surface of the cell well 103 is boosted by using the control gates CG of unselected memory cells. Accordingly, the de-trapping period T2 can be a short period of time. In addition, because charging only word lines WL will suffice, increase in the current consumption in the de-trapping period T2 is small.

Conventionally, a step-up voltage ΔVpgm at a writing time has to be set low, taking into account expansion of a threshold voltage distribution due to verification noise. On the other hand, in the first embodiment, expansion of the threshold voltage distribution after writing can be suppressed by a de-trapping operation. Therefore, the step-up voltage ΔVpgm can be set at a high level within a range not exceeding the threshold voltage distribution. When the step-up voltage ΔVpgm is high, the number of times of repeating the writing sequence can be reduced. Accordingly, even when the de-trapping period T2 is added, the entire writing time can be reduced by setting the step-up voltage ΔVpgm at a high level.

Figure 10:
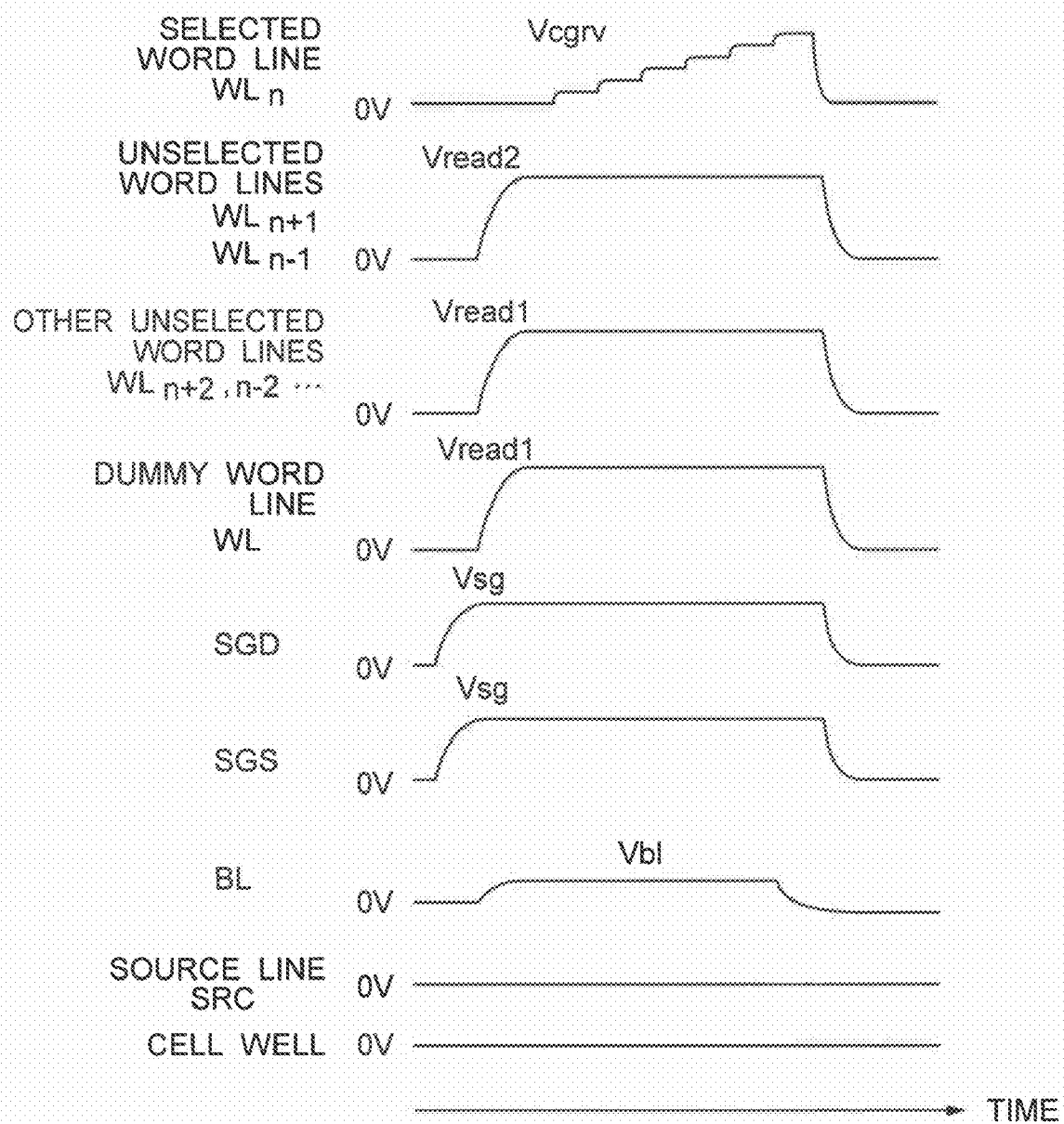
FIG. 10 shows voltage waveforms of word lines, a bit line, selector gate lines, a source line, and a cell well during a read operation of the NAND flash memory 100 according to the first embodiment.

FIG. 10 shows voltage waveforms of word lines, a bit line, selector gate lines, a source line, and a cell well during a read operation of the NAND flash memory 100 according to the first embodiment.

The waveforms during the read operation are identical to waveforms during the verification reading period T3 shown in FIG. 7, and detailed operations performed in the read operation are also identical to detailed operations performed in a verification read operation. In the first embodiment, a voltage of a selected word line is sequentially changed to a reference level Vcgrv at seven steps from a small level, but is not limited thereto.

In a floating-gate NAND flash memory, verification noise is generally caused by electron traps in a tunnel oxide film, and therefore, in the first embodiment, explanations are made by using electron traps. However, the kind of traps is not limited to electron traps. The present invention can be also applied to verification noise caused by hole traps, and can achieve the same effect.

Second Embodiment

FIG. 11 is a cross-sectional view showing a memory of a MONOS structure according to a second embodiment of the present invention. A MONOS structure employs a silicon oxide film or an ONO film (a laminated film of $SiO_2$—SiN—$SiO_2$), for example, for a tunnel dielectric film TI, and has a silicon nitride film, for example, for a charge holding layer (a charge trap layer) CT. The tunnel dielectric film TI is provided on the silicon substrate 103. The charge trap layer CT is provided on the tunnel dielectric film TI.

A block dielectric film BI is provided on the charge trap layer CT. The control gate CG is provided on the block dielectric film BI. In the second embodiment, the control gate CG is a laminated film of TaN, polysilicon, and silicide. Other configurations of a MONOS memory according to the second embodiment can be identical to those of the first embodiment.

The block dielectric film BI, the charge trap layer CT, and the tunnel dielectric film TI have small total film thicknesses of 20 nm to 30 nm, for example. That is, a distance between the control gate CG and the silicon substrate (the well) 103 is short. Therefore, a large electric field is applied between the control gate CG and the silicon substrate (the well), in a write operation and an erasure operation. Many charge traps are formed at an edge portion at an STI side of the tunnel oxide film TI by the electric field between the control gate CG and the silicon substrate (the well).

Operations of the second embodiment are identical to those of the first embodiment, and in the second embodiment, a de-trapping operation identical to that of the first embodiment is performed. Accordingly, in the second embodiment, electrons trapped at the edge portion at the STI side of the tunnel oxide film TI can be also forcibly eliminated.

The MONOS memory according to the second embodiment can also achieve effects identical to those of the first embodiment.

Third Embodiment

Figure 12:
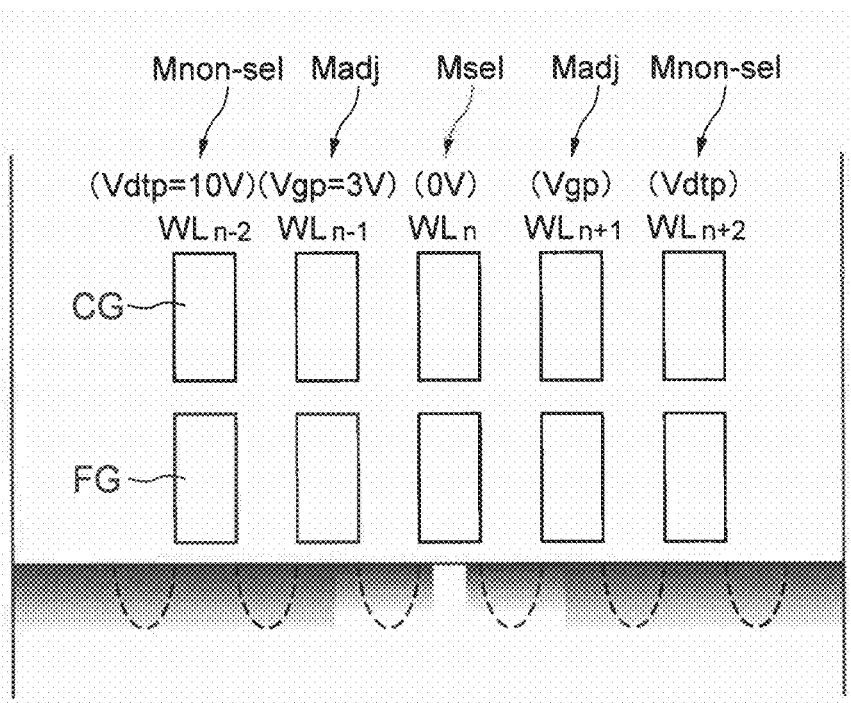
FIG. 12 is a cross-sectional view showing a NAND flash memory according to a third embodiment of the present invention.

FIG. 12 is a cross-sectional view showing a NAND flash memory according to a third embodiment of the present invention. FIG. 12 also shows a state that a potential of a channel of a NAND string is boosted. In FIG. 12, Msel denotes a selected memory cell to be written, Madj denotes unselected memory cells adjacent to the selected memory cell Msel, and Mnon-sel denotes unselected memory cells other than Madj.

In the third embodiment, the voltage applied to the control gates CG of the unselected memory cells Madj is different from that in the first or second embodiment. Other configurations of the third embodiment can be identical to those of the first or second embodiment.

In the de-trapping operation of the first and second embodiments, when a potential of a channel of the NAND string is excessively boosted due to a much higher potential of a channel of the selected memory cell Msel than a potential of the control gate CG of the selected memory cell Msel, GIDL has a risk of occurring at a diffusion layer end of the selected memory cell Msel.

When GIDL occurs, electrons or holes are injected into the floating gate FG near an occurrence position. This has a risk of changing a threshold value of the memory cell M. That is, this has a risk of disturbing the threshold value of the memory cell M.

In order to deal with the above problems, in the third embodiment, the control-gate-potential control circuit 9 and the row decoder 2 apply a third voltage to the control gates CG of the unselected memory cells Madj. The third voltage is lower than a voltage applied to the control gates CG of the unselected memory cells Mnon-sel, and is higher than a voltage 0 V of the silicon substrate (the cell well).

Assume that a voltage of the control gate CG (WLn) of the selected memory cell Msel is 0 V to 1 V, and that the voltage of the control gates CG (WLn−2 and WLn+2) of the unselected memory cells Mnon-sel is 10 V. In this case, a voltage Vgp of the control gates CG (WLn−1 and WLn+1) of the unselected memory cells Madj is 3 V, for example.

As described above, an electric field of a diffusion layer end of a source or a drain of the selected memory cell Msel can be reduced by setting the voltage of the control gates CG of the unselected memory cells Madj to lower than the voltage of the control gates CG of the unselected memory cells Mnon-sel. Consequently, occurrence of GIDL at a diffusion layer end of a source or a drain of the selected memory cell Msel can be suppressed. As a result, injection of electrons or holes into the floating gate FG near the occurrence position of the GIDL can be prevented. That is, a threshold value of a memory cell MC in a NAND string is not disturbed.

The third embodiment can be applied to either the first embodiment or the second embodiment. Accordingly, the third embodiment can also achieve the effects of the first and second embodiments. That is, in the third embodiment, electrons trapped by the tunnel oxide film TI can be eliminated while suppressing GILD in a de-trapping operation.

Fourth Embodiment

Figure 13:
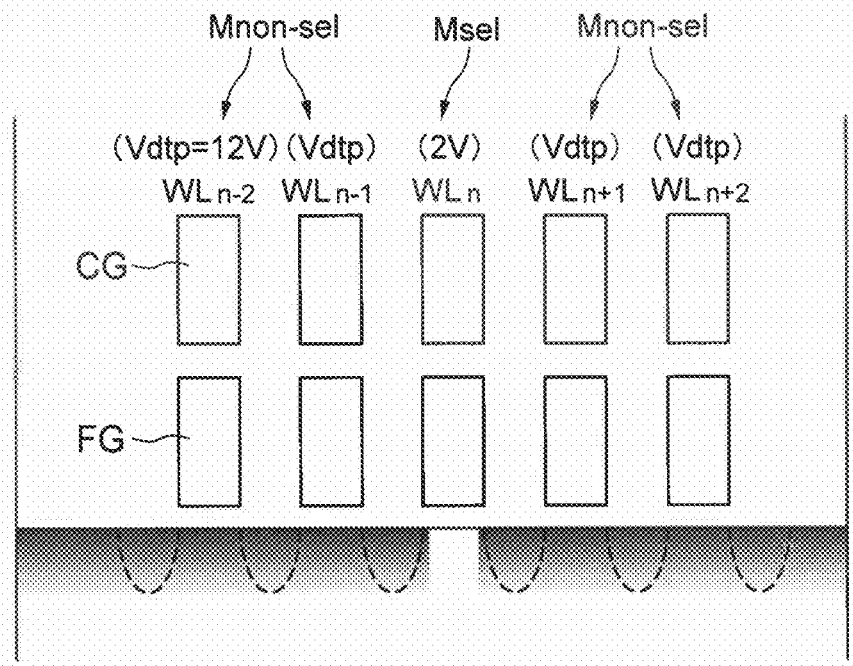
FIG. 13 is a cross-sectional view showing a NAND flash memory according to a fourth embodiment of the present invention.

FIG. 13 is a cross-sectional view showing a NAND flash memory according to a fourth embodiment of the present invention. FIG. 13 also shows a state that a potential of a channel of a NAND string is boosted. In FIG. 13, Msel denotes a selected memory cell to be written, and Mnon-sel denotes unselected memory cells other than Msel.

The configurations of the fourth embodiment can be identical to those of the first or second embodiment.

In the fourth embodiment, a voltage applied to the control gates CG of the selected memory cell Msel and the unselected memory cells Mnon-sel, respectively in a de-trapping operation is set slightly higher than that in the first or second embodiment. For example, a voltage applied to the control gate CG is set 2 V higher than that in the first or second embodiment. That is, a voltage applied to the control gate CG (WLn) of the selected memory cell Msel is about 2 V, and a voltage applied to the control gates CG (WLn−2, WLn−1, WLn+1, and WLn+2) of the unselected memory cells Mnon-sel is about 12 V.

When a voltage applied to the control gate CG (WLn) of the selected memory cell Msel is set higher than 0 V, GIDL at a diffusion layer end of a source or a drain of the selected memory cell Msel can be suppressed.

On the other hand, the difference between a voltage of the control gate CG of the selected memory cell Msel and a voltage of the control gates CG of the unselected memory cells Mnon-sel is 10 V, which is the same as that in the first or second embodiment. Therefore, a relative voltage of a channel of a NAND string to a voltage of the control gate CG of the selected memory cell Msel is the same as that in the first or second embodiment.

As a result, in the fourth embodiment, electrons trapped by the tunnel oxide film TI can be eliminated while suppressing GILD in a de-trapping operation.

Fifth Embodiment

Figure 14:
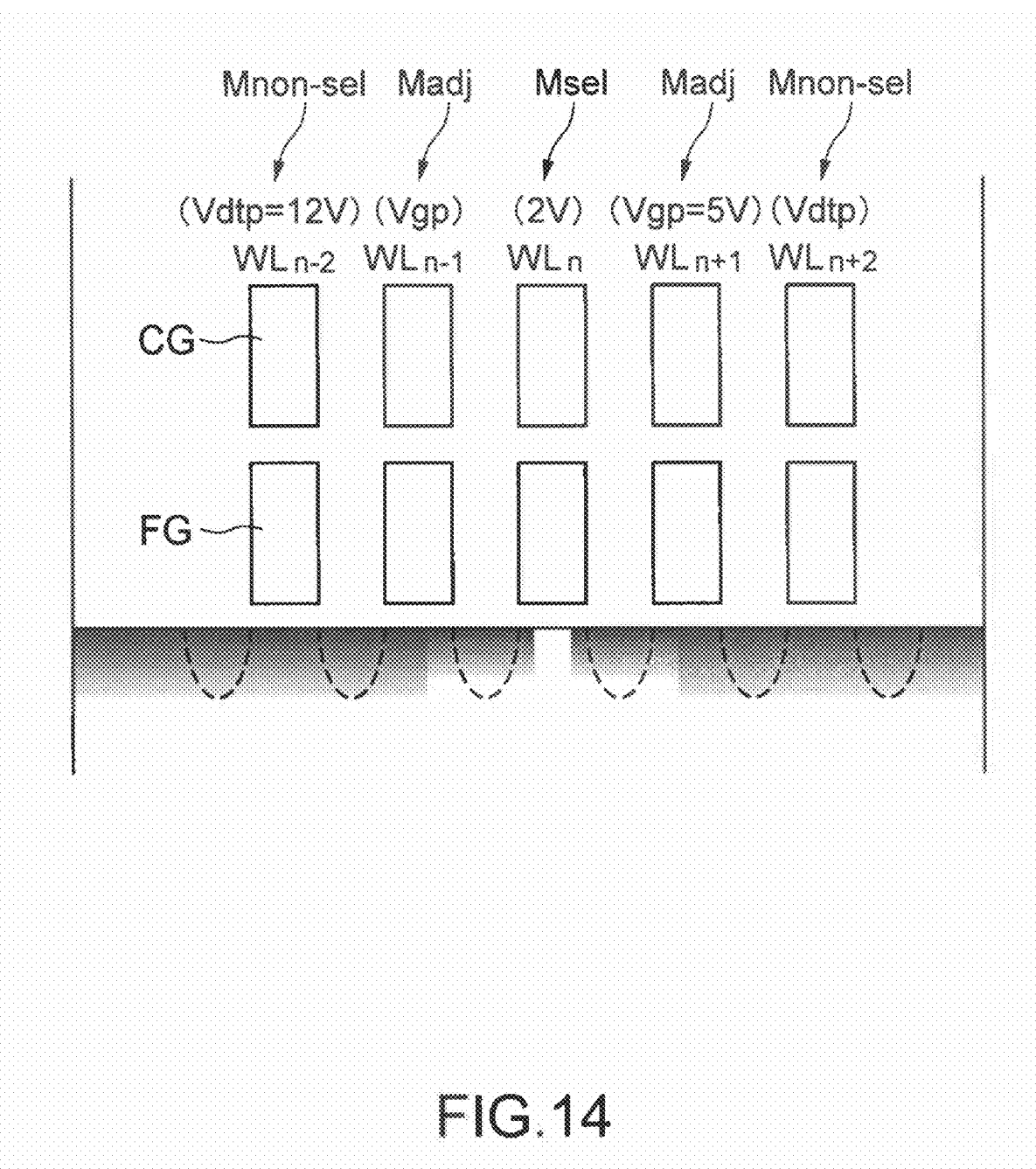
FIG. 14 is a cross-sectional view showing a NAND flash memory according to a fifth embodiment of the present invention.

FIG. 14 is a cross-sectional view showing a NAND flash memory according to a fifth embodiment of the present invention. FIG. 14 also shows a state that a potential of a channel of a NAND string is boosted. In FIG. 14, Msel denotes a selected memory cell to be written, Madj denotes unselected memory cells adjacent to the selected memory cell Msel, and Mnon-sel denotes unselected memory cells other than Madj.

The fifth embodiment is a combination of the third and fourth embodiments. Therefore, configurations of the fifth embodiment can be identical to those of the first or second embodiment. However, in the fifth embodiment, the voltage applied to the control gates CG of the unselected memory cells Madj is different from that of the third embodiment.

In the fifth embodiment, in a de-trapping operation, the control-gate-potential control circuit 9 and the row decoder 2 apply a third voltage to the control gates CG of the unselected memory cells Madj. The third voltage is lower than the voltage applied to the control gates CG of the unselected memory cells Mnon-sel, and is higher than a voltage 0 V of the silicon substrate (the cell well).

As an example, it is assumed that a voltage of the control gate CG (WLn) of the selected memory cell Msel is about 2 V, and that a voltage Vdtp of the control gates CG (WLn−2 and WLn+2) of the unselected memory cells Mnon-sel is about 12 V. In this case, a voltage Vgp of the control gates CG (WLn−1 and WLn+1) of the unselected memory cells Madj is 5 V, for example.

As described above, an electric field of a diffusion layer end of a source or a drain of the selected memory cell Msel can be reduced by setting the voltage of the control gates CG of the unselected memory cells Madj to lower than the voltage of the control gates CG of the unselected memory cells Mnon-sel. Consequently, electrons trapped by the tunnel oxide film TI can be eliminated while suppressing occurrence of GIDL at a diffusion layer end of a source or a drain of the selected memory cell Msel. Further, in the fifth embodiment, a voltage applied to the control gate CG (WLn) of the selected memory cell Msel is set higher than 0 V. As a result, GIDL can be further suppressed.

The fifth embodiment can be applied to either the first or second embodiment. Accordingly, the fifth embodiment can also achieve the effects of the first or second embodiment.

Sixth Embodiment

Figure 15:
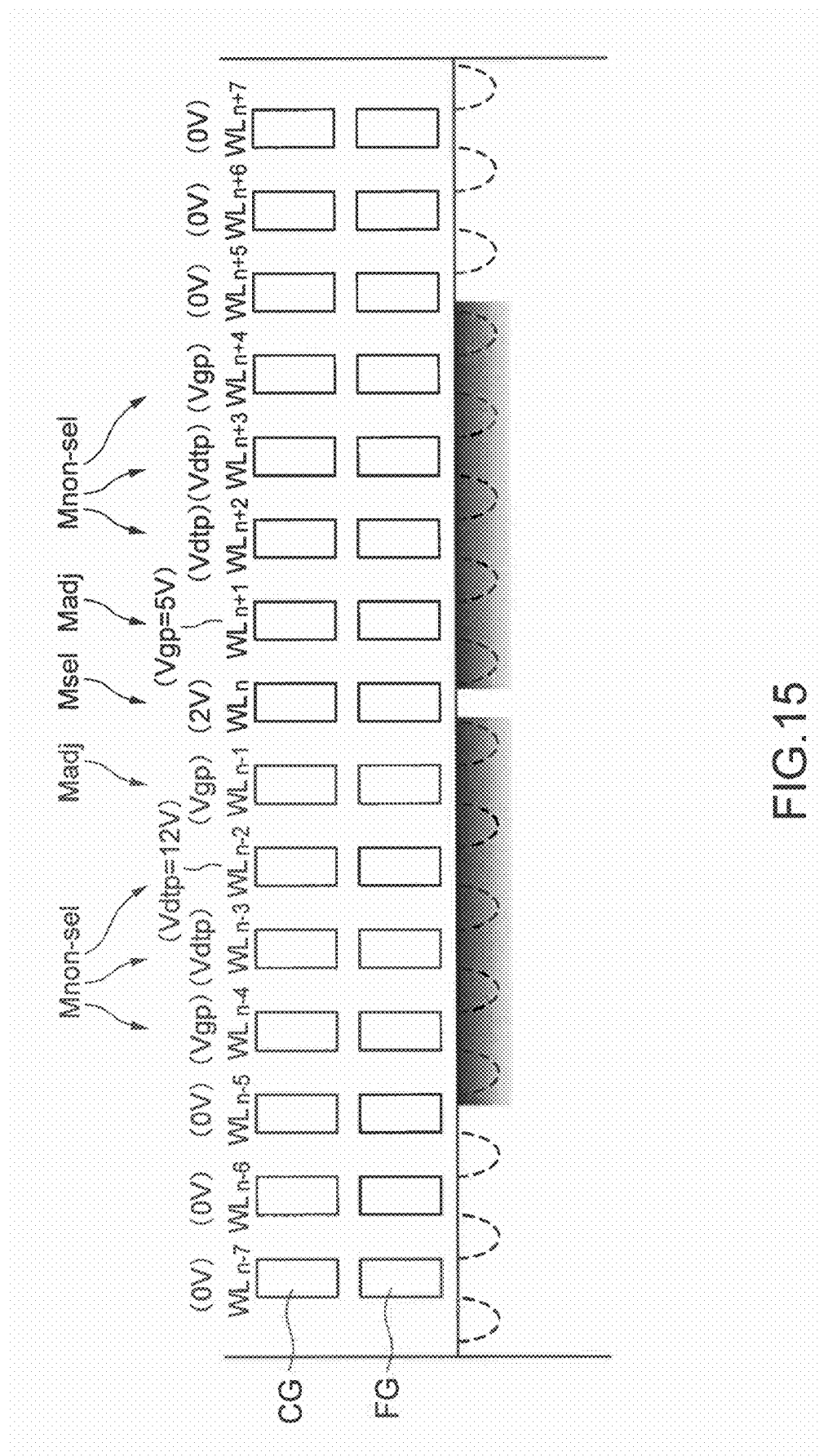
FIG. 15 is a cross-sectional view showing a NAND flash memory according to a sixth embodiment of the present invention.

FIG. 15 is a cross-sectional view showing a NAND flash memory according to a sixth embodiment of the present invention. FIG. 15 also shows a state that a potential of a channel of a NAND string is boosted.

In the sixth embodiment, voltages of the control gates CG of the selected memory cell Msel, the unselected memory cells Madj, and the unselected memory cells Mnon-sel near these memory cells are identical to those in the fifth embodiment. However, in the sixth embodiment, 0 V is applied to the control gates CG of the unselected memory cells Mnon-sel separated from the selected memory cell Msel. On the other hand, a voltage Vdtp is applied to the control gates CG of several unselected memory cells Mnon-sel near the selected memory cell Msel.

A de-trapping operation is performed to the selected memory cell Msel to be written. Therefore, in order to de-trap, it suffices to boost only a potential of a chip of the selected memory cell Msel and potentials near this channel. That is, it is not necessary to boost potentials of channels of the unselected memory cells Mnon-sel separated from the selected memory cell Msel.

Rather, setting Vdtp applied to the control gates CG of the unselected memory cells Mnon-sel to a high level causes program disturbance. In the sixth embodiment, in order to suppress program disturbance, 0 V is applied to the control gates CG of the unselected memory cells Mnon-sel separated from the selected memory cell Msel. With this arrangement, power consumption can be reduced while suppressing program disturbance.

The sixth embodiment can be applied to any one of the first to fifth embodiments. Accordingly, the sixth embodiment can also achieve the effects of any one of the first to fifth embodiments.

As shown in FIG. 15, Vgp=5 V is applied to the control gates CG of memory cells at both ends of the unselected memory cells Mnon-sel applied with Vdtp, in a similar manner to that applied to control gates of the unselected memory cells Madj. This voltage application is performed to suppress the occurrence of GIDL by mitigating electric fields of channels at both ends of the unselected memory cells Mnon-sel applied with Vdtp.

Seventh Embodiment

Figure 16:
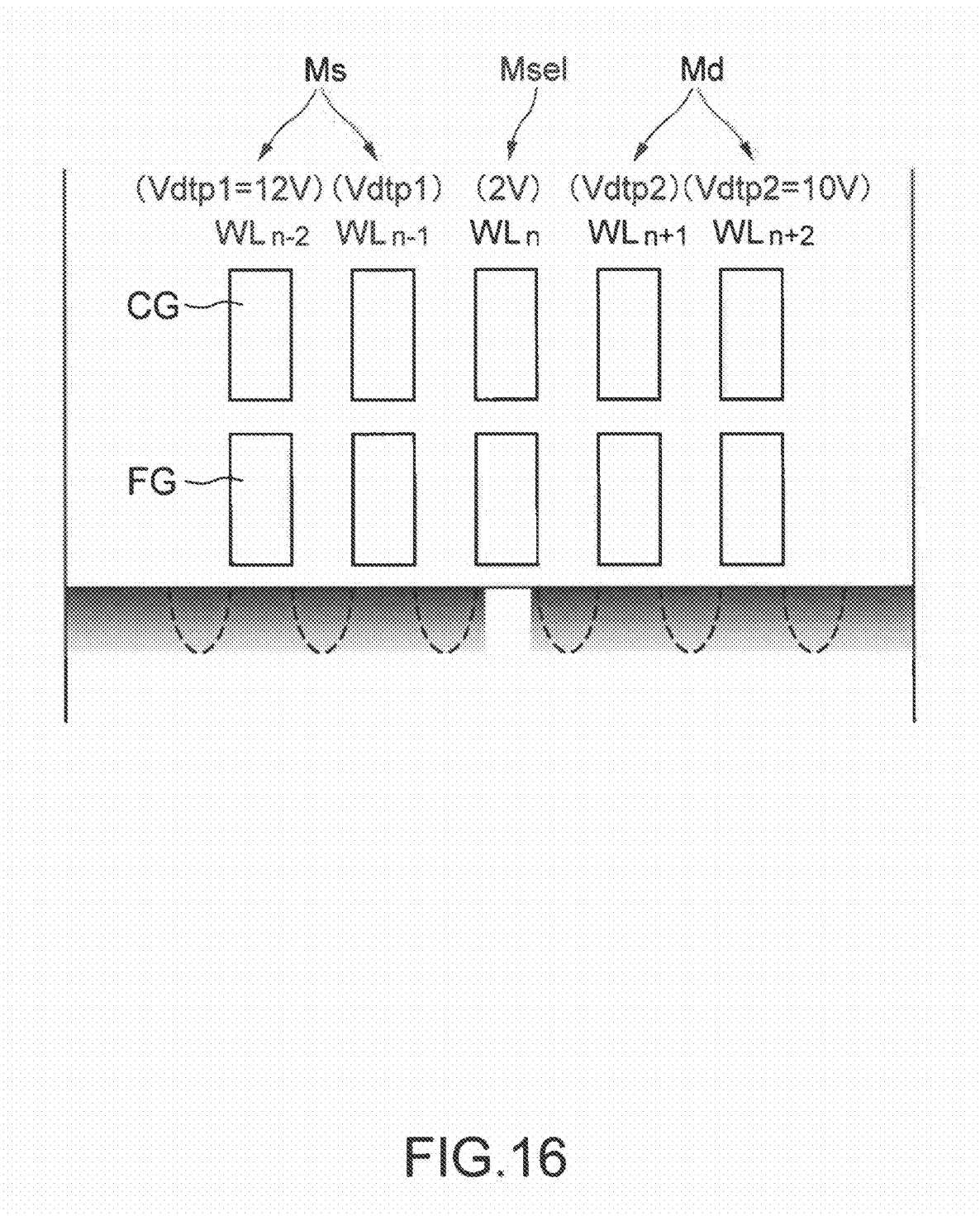
FIG. 16 is a cross-sectional view showing a NAND flash memory according to a seventh embodiment of the present invention.

FIG. 16 is a cross-sectional view showing a NAND flash memory according to a seventh embodiment of the present invention. FIG. 16 also shows a state that a potential of a channel of a NAND string is boosted. In FIG. 16, Ms denotes unselected memory cells at a source side of the selected memory cell Msel, and Md denotes unselected memory cells at a drain side of the selected memory cell Msel.

Normally, in the NAND flash memory, writing is performed from the memory cell M at a source side. Therefore, there is a high probability that data is already written in the unselected memory cells Ms (electrons are held in the floating gate FG).

When data is already written in the unselected memory cells Ms, potentials of channels of the unselected memory cells Ms are not easily boosted. On the other hand, potentials of channels of the unselected memory cells Md in which data is not written are easily boosted. Therefore, a voltage Vdtp1 of the control gates CG of the unselected memory cells Ms is set higher than a voltage Vdtp2 of the control gates CG of the unselected memory cells Md. For example, Vdtp1 is set to about 12 V, and Vdtp2 is set to about 10 V.

With this arrangement, in a de-trapping operation, a difference between a boosted potential of channels of the unselected memory cells Ms and a boosted potential of channels of the unselected memory cells Md can be set small, and both potentials are set substantially equal to each other.

The seventh embodiment can be applied to any one of the first to sixth embodiments. When the seventh embodiment is applied to the third, fifth, or sixth embodiment, it suffices that the voltage of the control gates CG of the unselected memory cells Madj is set lower than the voltage of the control gates CG of other unselected memory cells Mnon-sel, as shown in FIGS. 12, 13, and 15.

Eighth Embodiment

Figure 17:
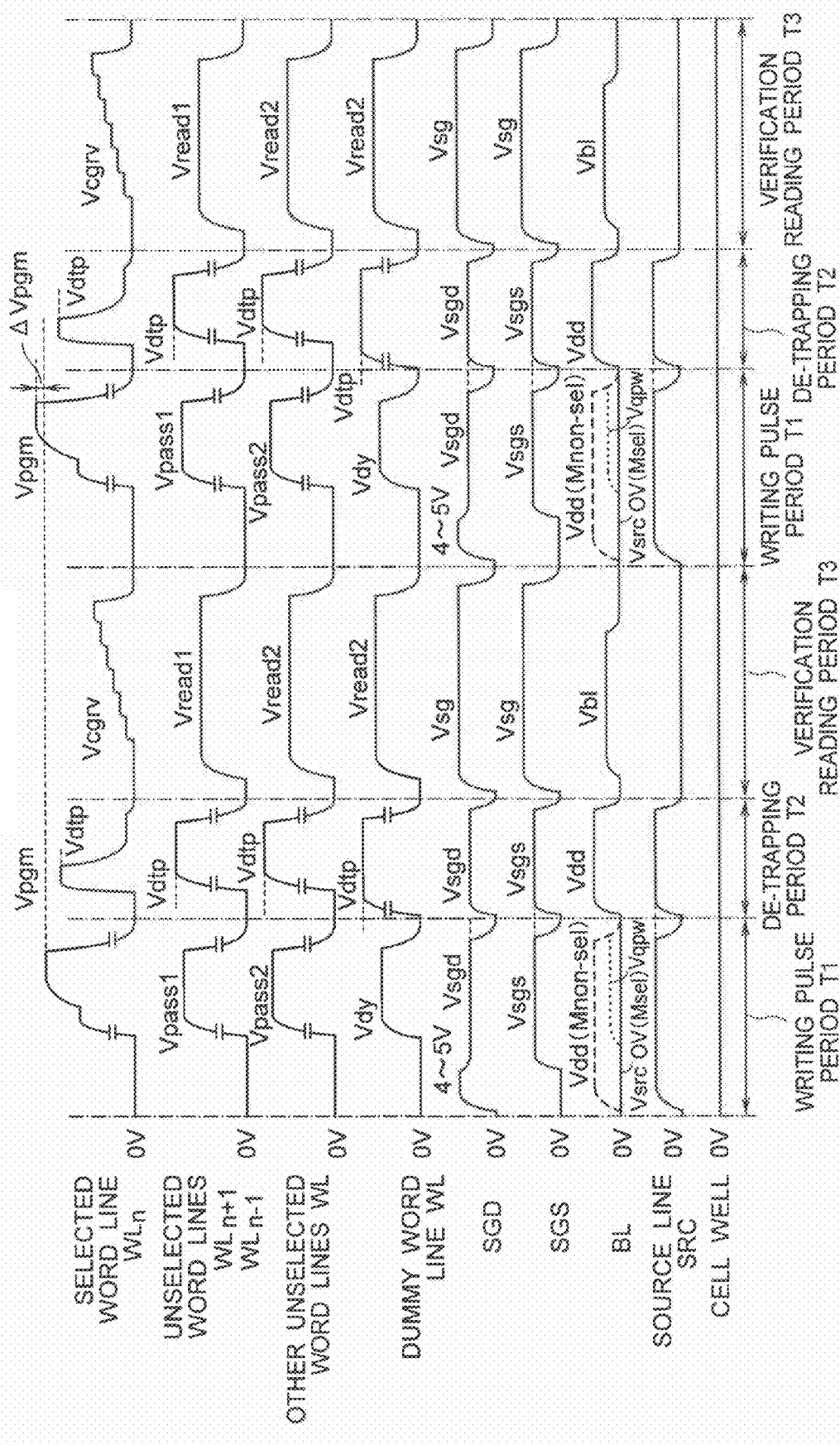
FIG. 17 is a timing diagram showing an operation of a NAND flash memory according to an eighth embodiment of the present invention.

FIG. 17 is a timing diagram showing an operation of a NAND flash memory according to an eighth embodiment of the present invention. In the eighth embodiment, in a de-trapping operation, a potential of the selected word line WLn is once increased to Vdtp, and thereafter, is reduced to 0 V or to a voltage slightly higher than 0 V. Other operations of the eighth embodiment can be identical to those of the first embodiment. Configurations of the eighth embodiment can be also identical to those of the first embodiment.

As described above, potentials of channels of unselected memory cells at a source side in which data is already written are not easily boosted. On the other hand, potentials of channels of unselected memory cells at a drain side in which data is not written are easily boosted. Therefore, when the same potentials are applied to the control gates CG of the unselected memory cells, boosted potentials of channels of the unselected memory cells at a drain side become higher than boosted potentials of channel of the unselected memory cells at a source side. In this case, a current flows from the channels of the unselected memory cells at a drain side to the channels of the unselected memory cells at a source side. This current causes disturbance (erroneous writing).

In order to deal with this problem, in the eighth embodiment, a potential of the selected word line WLn is once increased to Vdtp in a de-trapping operation. Accordingly, a potential of a channel immediately below the selected word line WLn is boosted, and the channel in which the potential is boosted immediately below the selected word line WLn is not disconnected. Consequently, boosted potentials of channels of the unselected memory cells at a drain side become the same as boosted potentials of channels of the unselected memory cells at a source side. As a result, the above disturbance can be suppressed.

The eighth embodiment can be applied to either the fourth or sixth embodiment. Accordingly, the eighth embodiment can also achieve the effects of the fourth or sixth embodiment.

Ninth Embodiment

Figure 18:
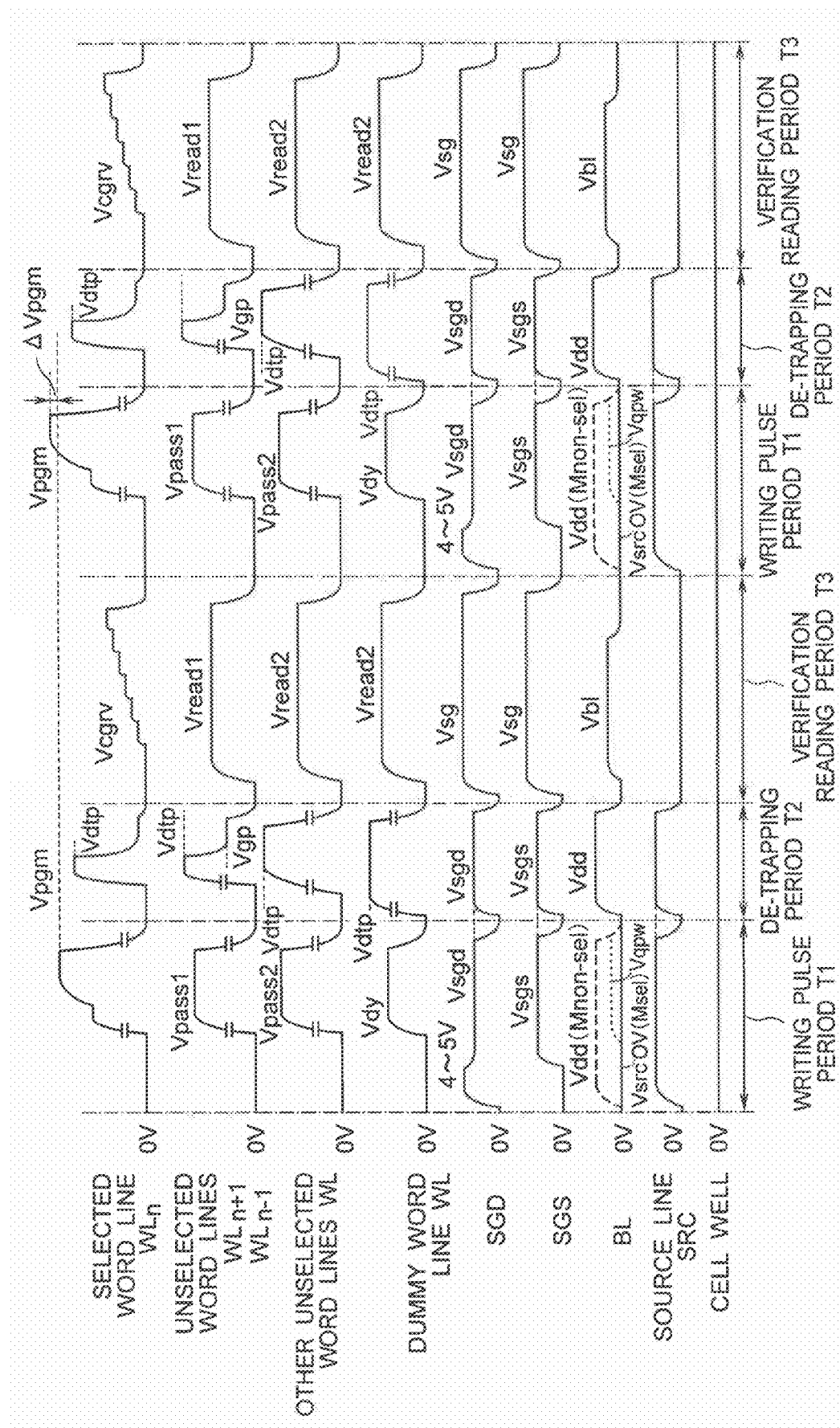
FIG. 18 is a timing diagram showing an operation of a NAND flash memory according to a ninth embodiment of the present invention.

FIG. 18 is a timing diagram showing an operation of a NAND flash memory according to a ninth embodiment of the present invention. The ninth embodiment is a combination of the third and eighth embodiments. Therefore, in the ninth embodiment, in a de-trapping operation, a potential of the selected word line WLn is once increased to Vdtp, and thereafter, is reduced to 0 V or to a voltage slightly higher than 0 V. Further, potentials of the control gates CG (WLn+1 and WLn−1) of the unselected memory cells Madj adjacent to the selected memory cell Msel are also once increased to Vdtp, and thereafter, are reduced to Vgp.

Other operations of the ninth embodiment can be identical to those of the third embodiment. Configurations of the ninth embodiment can be also identical to those of the third embodiment.

In the ninth embodiment, in a de-trapping operation, potentials of the selected word line WLn, and the unselected word lines WLn+1 and WLn−1 are once increased to Vdtp. Accordingly, potentials of channels are boosted below the selected word line WLn, and the unselected word lines WLn+1 and WLn−1. The channels of the boosted potentials of the selected word line WLn, and the unselected word lines WLn+1 and WLn−1 are not disconnected. Consequently, the boosted potentials of the channels of the unselected memory cells at a drain side become equal to the boosted potentials of the channels of the unselected memory cells at a source side. As a result, disturbance can be suppressed in a similar manner to that in the eighth embodiment.

The ninth embodiment can be applied to either the fifth or sixth embodiment. Accordingly, the ninth embodiment can also achieve the effects of the fifth or sixth embodiment.

The invention claimed is:

1. A NAND flash memory comprising:
a NAND string in which a plurality of memory cells are connected in series to store information corresponding to an amount of charges held in a charge holding layer, the memory cells respectively comprising a semiconductor well on a surface of a semiconductor substrate, a first insulation film on the semiconductor well, the charge holding layer on the first insulation film, a second insulation film on the charge holding layer, and a control gate above the second insulation film; and
a control circuit configured to control voltages applied to the control gate and the semiconductor well, wherein
in a write operation, the control circuit applies a writing voltage between the control gate of a selected memory cell to be written and the semiconductor well, and
after the write operation and before performing a verification read operation of verifying whether data has been written into the selected memory cell, the control circuit performs a de-trapping operation, in which a first voltage of a same potential as that of the semiconductor well or a same polarity as that of the writing voltage is applied to the control gate of the selected memory cell and in which a second voltage of a same polarity as that of the writing voltage and larger than the first voltage as an absolute value is applied to a control gates of unselected memory cells not to be written.

2. The NAND flash memory of claim 1, wherein the second voltage is substantially equal to a voltage applied to the control gates of the unselected memory cells, in the write operation.

3. A NAND flash memory comprising:
a NAND string in which a plurality of memory cells are connected in series to store information corresponding to an amount of charges held in a charge holding layer, the memory cells respectively comprising a semiconductor well on a surface of a semiconductor substrate, a first insulation film on the semiconductor well, the charge holding layer on the first insulation film, a second insulation film on the charge holding layer, and a control gate above the second insulation film; and
a control circuit configured to control voltages applied to the control gate and the semiconductor well, wherein
in a write operation, the control circuit applies a writing voltage between the control gate of a selected memory cell to be written and the semiconductor well, and
after the write operation and before performing a verification read operation of verifying whether data has been written into the selected memory cell, the control circuit performs a de-trapping operation, in which a first voltage of a same potential as that of the semiconductor well or a same polarity as that of the writing voltage is applied to the control gate of the selected memory cell and in which a second voltage of a same polarity as that of the writing voltage and larger than the first voltage as an absolute value is applied to a control gate of a first unselected memory cell which is not adjacent to the selected memory cell, and a third voltage of a same polarity as that of the writing voltage and smaller than the second voltage as an absolute value is applied to a control gate of a second unselected memory cell which is adjacent to the selected memory cell.

4. The NAND flash memory of claim 1, wherein in the de-trapping operation, the control circuit applies the second voltage to the control gates of unselected memory cells near the selected memory cell, and applies a same potential as a potential of the semiconductor well to the control gates of the unselected memory cells separated from the selected memory cell.

5. The NAND flash memory of claim 2, wherein in the de-trapping operation, the control circuit applies the second voltage or the third voltage to the control gate of unselected memory cells near the selected memory cell, and applies a same potential as a potential of the semiconductor well to the control gate of the unselected memory cells separated from the selected memory cell.

6. The NAND flash memory of claim 3, wherein in the de-trapping operation, the control circuit applies the second voltage or the third voltage to the control gate of unselected memory cells near the selected memory cell, and applies a same potential as a potential of the semiconductor well to the control gate of the unselected memory cells separated from the selected memory cell.

7. The NAND flash memory of claim 1, wherein in the de-trapping operation, the control circuit applies a higher voltage to the control gates of the unselected memory cells at a source side of the selected memory cell than a voltage of the control gates of the unselected memory cells at a drain side of the selected memory cell.

8. The NAND flash memory of claim 2, wherein in the de-trapping operation, the control circuit applies a higher voltage to the control gates of the unselected memory cells at a source side of the selected memory cell than a voltage of the control gates of the unselected memory cells at a drain side of the selected memory cell.

9. The NAND flash memory of claim 3, wherein in the de-trapping operation, the control circuit applies a higher voltage to the control gates of the unselected memory cells at a source side of the selected memory cell than a voltage of the control gates of the unselected memory cells at a drain side of the selected memory cell.

10. The NAND flash memory of claim 4, wherein in the de-trapping operation, the control circuit applies a higher voltage to the control gates of the unselected memory cells at a source side of the selected memory cell than a voltage of the control gates of the unselected memory cells at a drain side of the selected memory cell.

11. The NAND flash memory of claim 1, wherein in the de-trapping operation, the control circuit once applies the second voltage to the control gate of the selected memory cell, and thereafter applies the first voltage to the control gate of the selected memory cell.

12. The NAND flash memory of claim 2, wherein in the de-trapping operation, the control circuit once applies the second voltage to the control gate of the selected memory cell, and thereafter applies the first voltage to the control gate of the selected memory cell.

13. The NAND flash memory of claim 3, wherein in the de-trapping operation, the control circuit once applies the second voltage to the control gate of the selected memory cell, and thereafter applies the first voltage to the control gate of the selected memory cell.

14. The NAND flash memory of claim 4, wherein in the de-trapping operation, the control circuit once applies the second voltage to the control gate of the selected memory cell, and thereafter applies the first voltage to the control gate of the selected memory cell.

15. The NAND flash memory of claim 7, wherein in the de-trapping operation, the control circuit once applies the second voltage to the control gate of the selected memory cell, and thereafter applies the first voltage to the control gate of the selected memory cell.

16. The NAND flash memory of claim 3, wherein in the de-trapping operation, the control circuit once applies the second voltage to the control gates of the second unselected memory cells, and thereafter applies the third voltage to the control gates of the second unselected memory cells.

* * * * *